United States Patent
Amin et al.

(10) Patent No.: US 11,545,225 B1
(45) Date of Patent: Jan. 3, 2023

(54) "READ AFTER ERASE" METHOD FOR CATCHING SINGLE WORD LINE "SLOW TO ERASE" SIGNATURE IN NONVOLATILE MEMORY STRUCTURES

(71) Applicant: SanDisk Technologies LLC, Addison, TX (US)

(72) Inventors: Parth Amin, Fremont, CA (US); Anubhav Khandelwal, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 8 days.

(21) Appl. No.: 17/356,823

(22) Filed: Jun. 24, 2021

(51) Int. Cl.
*G11C 16/34* (2006.01)
*G11C 16/04* (2006.01)
*G11C 16/14* (2006.01)
*G11C 16/26* (2006.01)
*G11C 16/08* (2006.01)
*G11C 11/56* (2006.01)

(52) U.S. Cl.
CPC ...... *G11C 16/3445* (2013.01); *G11C 16/0483* (2013.01); *G11C 16/08* (2013.01); *G11C 16/14* (2013.01); *G11C 16/26* (2013.01); *G11C 11/5635* (2013.01); *G11C 11/5671* (2013.01)

(58) Field of Classification Search
CPC .................................................. G11C 16/3445
See application file for complete search history.

(56) References Cited

U.S. PATENT DOCUMENTS 9,449,698 B1 * 9/2016 Paudel ............... G11C 16/3445

* cited by examiner

*Primary Examiner* — Jason Lappas
(74) *Attorney, Agent, or Firm* — Dickinson Wright PLLC; Steven C. Hurles

(57) ABSTRACT

A method for detecting a "slow to erase" condition of a non-volatile memory structure, wherein the method comprises initiating an erase/verify memory operation with respect to the memory structure, wherein the erase/verify memory operation comprises applying an erase verify voltage according to an alternating word line scheme; following the erase/verify memory operation, determining if a first bit scan mode criteria is satisfied; and, if the first bit scan mode criteria is satisfied, initiating a read/verify memory operation wherein, the read/verify memory operation comprises applying a read-pass voltage according to an all word line scheme, and a magnitude of the read-pass voltage is greater than a magnitude of the erase verify voltage. Following the read/verify memory operation, the method also comprises determining if a second bit scan mode criteria is satisfied and, if the criteria is not satisfied, designating the memory structure with a fail status.

20 Claims, 19 Drawing Sheets

"READ AFTER ERASE" METHOD FOR CATCHING SINGLE WORD LINE "SLOW TO ERASE" SIGNATURE IN NONVOLATILE MEMORY STRUCTURES

TECHNICAL FIELD

This disclosure relates to non-volatile memory storage systems in solid-state drives or other devices, including but not limited to flash drives or embedded/removable flash packages. More specifically, this disclosure relates to systems and methods for detecting, in advance of a resulting uncorrectable error code correction (UECC) occurrence, a "slow to erase" threshold voltage ($V_{th}$) signature with respect to a defective non-volatile memory structure.

BACKGROUND

Due to emerging technology and market forces, solid-state drives (SSDs) are steadily replacing previously conventional data storage systems that rely on the rotation of magnetic mediums for reading and writing data (e.g., hard disk drives). Rather than comprising any mechanical or moving parts, solid-state memory comprises integrated circuit assemblies or interconnected flash components to provide non-volatile storage in which stored data can be persistently retained even during a planned or unplanned interruption of power. As a result, a solid-state drive is inherently faster and more robust (i.e., less susceptible to data loss and corruption), as well as consumes less power and is more compact in comparison to disk-based storage. Accordingly, non-volatile memory is a powerful storage solution with respect to many types of computing, consumer electronic, and stand-alone external storage (e.g., USB drives) devices.

With respect to some flash memory types, each individual memory cell comprises a floating gate that is positioned above and isolated from a channel region of a semiconductor substrate, wherein the floating gate is positioned between the source and drain regions. Also, a control gate is provided over and isolated from the floating gate. Accordingly, the threshold voltage ($V_{th}$) of the resulting transistor is controlled by and dependent on the amount of charge retained on the floating gate. Specifically, in a switch-like manner, the minimum amount of voltage that must be applied to the control gate before the transistor is activated to permit conduction between its source and drain is determined by the level of charge retained on the floating gate. As a result, bit-value data can be programmed onto and erased from the memory cell by changing the level of charge on a floating gate in order to change the threshold voltage characteristic of the transistor.

As explained in detail below, the number of bits that can be stored in an individual memory cell is dependent upon the number of distinct voltage ranges that may be partitioned within the threshold voltage window of that memory cell. For example, to store one bit of data (referred to as binary data), the possible threshold voltages ($V_{th}$) of the memory cell are divided into two ranges, wherein the ranges are assigned as logical data "1" and "0" respectively. A memory cell characterized by this type of storage density may be referred to as a "single-level cell" or SLC.

By further partitioning the threshold voltage window of a memory cell into additional distinct voltage ranges, multiple levels of information can be stored. Such a memory cell may be referred to as a "multi-state cell." For example, to store two bits of data, the threshold voltage window of a cell may be partitioned into four distinct voltage ranges (or states), wherein each range is assigned a certain bit value that is equal to, for example, "11," "10," "01," and "00." Accordingly, after an erase operation, the threshold voltage is negative and, therefore, may be defined as logic "11." Therefore, the positive threshold voltages may be used for the states of "10," "01," "00." A memory cell of this storage density may be referred to as, for example, a "multi-level cell" or MLC. In another example, to store three bits of data, the voltage threshold window of a cell may be partitioned into eight distinct voltage ranges (or states), wherein each range is assigned a certain bit value that is equal to, for example, "111," "110," "100," "010," "011," "000," "001," and "101." A memory cell of this storage density may be referred to, for example, as a "tri-level" or "triple-level cell" (TLC). In a further example, to store four bits of data, the voltage threshold window of a memory cell may be partitioned into 16 distinct voltage ranges (or states), wherein each voltage range is assigned a certain bit value that is equal to, for example, "1111," "1110," "1100," "1000," "0111," "0011," "0001," "0000," "0001," "1001," "1101," "1011," "0110," "0100," "0101," and "1010." A memory cell of this type of storage density may be referred to, for example, as a "quad-level cell" (QLC).

The specific relationship between the data that is programmed into a memory cell and the threshold voltage levels of the memory cell depends upon the data encoding scheme that is adopted for the memory cells.

In addition to the increasing storage densities with respect to a single memory cell, advances in non-volatile memory array structures have led to memory cells being stacked in a vertical direction with respect to the semiconductor substrate, thus creating a three-dimensional array structure as opposed to a planar two-dimensional array structure. However, the lack of separation between the charge trapping regions of the memory cells in three-dimensional array structures provide further challenges with respect to the reliability and the retention of the programmed data.

Accordingly, as the industry continues to achieve smaller sized memory cells with increased storage densities in order to store more data, this scaling of size entails certain performance and durability risks. In order to achieve the advantage of higher memory capacity for a fixed die size, smaller memory cells must be packed more closely together. Doing so, however, may result in an increased number of manufacturing, memory operation, and performance errors. For example, potentially catastrophic structural defects that occur between neighboring components, such as electrical shorting between adjacent word lines, occur more readily in compacted spaces. The description below chiefly addresses the deleterious "slow to erase" signature effect that may be linked to various structural defects occurring during device fabrication such as a single word line-to-memory hole (WL-MH) short. According to certain observations, such a defect may result in a discernible threshold voltage ($V_{th}$) distribution of an "erase" state following a programming operation of a memory structure. As such, following a subsequent erase verify operation, this "trailing" threshold voltage ($V_{th}$) distribution remains, thereby damaging the reliability and integrity of the programming data operations. Due to a combination of physical/electrical factors discussed in detail below, this "trailing" threshold voltage ($V_{th}$) distribution of the "erase" state may readily pass in an erase verify bit scan mode, thus going undetected and creating a parasitic effect. Thus, it would be beneficial to derive a device mode that can detect this "slow to erase" signature defect at the same operational juncture as the erase verify operation.

SUMMARY

Various embodiments include a method for detecting a "slow to erase" condition of a non-volatile memory structure, wherein the method comprises initiating an erase/verify memory operation with respect to the memory structure, wherein the erase/verify memory operation comprises applying an erase verify voltage level to the memory structure according to an alternating word line scheme; following the erase/verify memory operation, determining if a first bit scan mode criteria is satisfied; and if the first bit scan mode criteria is satisfied, initiating a read/verify memory operation, wherein the read/verify memory operation comprises applying a read-pass voltage level to the memory structure according to an all word line scheme and a magnitude of the read-pass voltage level is greater than a magnitude of the erase verify voltage level. Following the read/verify memory operation, the method also comprises determining if a second bit scan mode criteria is satisfied and, if it is determined that the second bit scan mode criteria is not satisfied, designating the memory structure with a fail status.

Other embodiments include a memory controller comprising a first communication pathway configured to couple to a non-volatile memory structure. The memory controller is configured to initiate an erase/verify memory operation with respect to the memory structure, wherein the erase/verify memory operation comprises applying an erase verify voltage level according to an alternating word line scheme; following the erase/verify memory operation, determine if a first bit scan mode criteria is satisfied; and if the first bit scan mode criteria is satisfied, initiate a read/verify memory operation, wherein the read/verify memory operation comprises applying a read-pass voltage to the memory structure according to an all word line scheme and a magnitude of the read-pass voltage is greater than a magnitude of the erase verify voltage. The memory controller is further configured to, following the read/verify memory operation, determine if a second bit scan mode criteria is satisfied and, if it is determined that the second bit mode scan criteria is not satisfied, designate the memory structure with a fail status.

Additional embodiments include a non-volatile memory system comprising a memory structure and a memory controller that is coupled to the memory structure, with the memory controller initiating an erase/verify memory operation with respect to the memory structure, wherein the erase/verify memory operation comprises applying an erase verify voltage level according to an alternating word line scheme; following the erase/verify memory operation, determining if a first bit scan mode criteria is satisfied; and if the first bit scan mode criteria is satisfied, initiating a read/verify memory operation, wherein the read/verify memory operation comprises applying a read-pass voltage to the memory structure according to an all word line scheme and a magnitude of the read-pass voltage level is greater than a magnitude of the erase verify voltage level. And wherein, following the read/verify memory operation, the memory controller determining if a second bit scan mode criteria is satisfied and, if the second bit scan mode criteria is not satisfied, designating the memory structure with a fail status.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope, the disclosure is described and explained with added specificity and detail through the use of the accompanying drawings in which.

DETAILED DESCRIPTION

Figure 1:
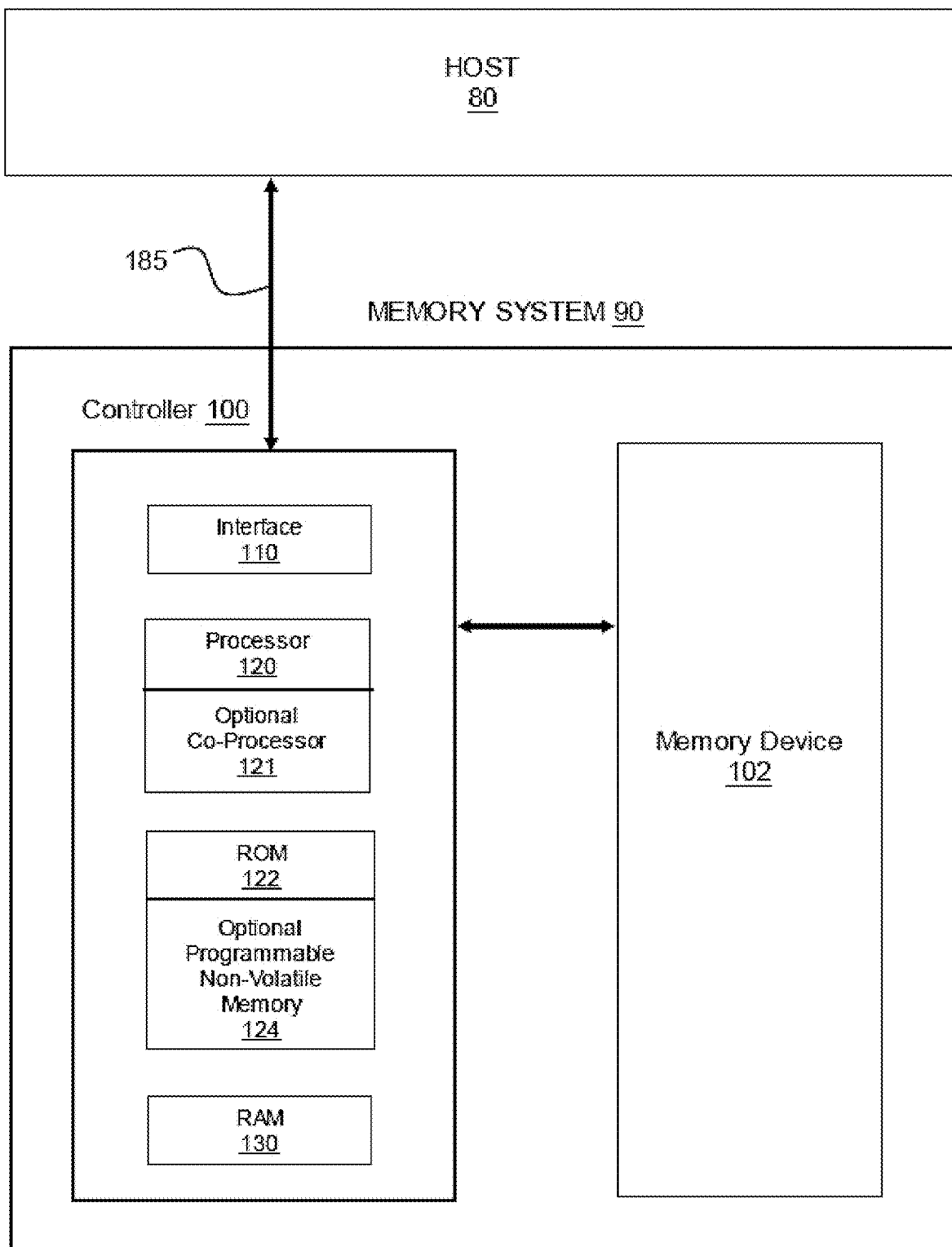
FIG. 1 is a block diagram of a memory system, in accordance with exemplary embodiments.

The following description is directed to various exemplary embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the detailed explanation of any specific embodiment is meant only to be exemplary of that embodiment and is not intended to suggest that the scope of the disclosure, including the claims, is limited to that particular embodiment.

The several aspects of the present disclosure may be embodied in the form of an apparatus, system, method, or computer program process. Therefore, aspects of the present disclosure may be entirely in the form of a hardware embodiment or a software embodiment (including but not limited to firmware, resident software, micro-code, or the like), or may be a combination of both hardware and software components that may generally be referred to collectively as a "circuit," "module," "apparatus," or "system." Further, various aspects of the present disclosure may be in the form of a computer program process that is embodied, for example, in one or more non-transitory computer-readable storage media storing computer-readable and/or executable program code.

Additionally, various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that comprises customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it comprises one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Thus, methods and means for these functions are described herein. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Further, the terms "program," "software," "software application," and the like as used herein, refer to a sequence of instructions designed for execution on a computer-implemented system. Accordingly, a "program," "software," "application," "computer program," or "software application" may include a subroutine, a function, a procedure, an object method, an object implementation, an executable application, an applet, a servlet, a source code, an object code, a shared library/dynamic load library and/or other sequence of specific instructions designed for execution on a computer system.

Additionally, the terms "couple," "coupled," or "couples," where used herein, are intended to mean either a direct or an indirect connection. Thus, if a first device couples, or is coupled to, a second device, that connection may be by way of a direct connection or through an indirect connection via other devices (or components) and connections.

Regarding the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that comprises the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or mores," "ones or more," and/or "ones or mores" according to set theory, unless expressly specified otherwise.

Various elements of the present disclosure are described below with reference to schematic flowchart diagrams and/or schematic block diagrams depicting methods, apparatuses, systems, and computer program processes according to exemplary embodiments of the present disclosure, wherein each block, or combinations of blocks, of the schematic flowchart and/or schematic block diagrams, can be implemented by specifically-written computer program instructions. As is understood in the art, the computer program instructions are executed by a designated processor of a computer or other programmable data processing apparatus, thereby creating the mechanisms for implementing the functions, acts, and/or operations specifically set forth in the one or more blocks of the schematic flowchart and/or schematic block diagrams. Further, it is noted that, in certain alternative process implementations, the functions specified in a block may occur out of the precise order depicted in the schematic flowchart and/or block diagrams. For example, two blocks depicted in the diagram as occurring in succession may, in fact, be executed substantially at the same time (i.e., concurrently), or even executed in a reverse order, depending upon the functionality involved. In addition, other process steps and methods that are equivalent in function, logic, or effect to one or more blocks, or portions thereof, of the diagrams may be conceived and are contemplated as being within the scope of the present disclosure. Furthermore, although the schematic diagrams may depict various arrow types and directions and line types as a matter of illustration, they are not intended to limit the scope of corresponding embodiments. For instance, an arrow may represent or signify a waiting or monitoring period of unspecified duration between enumerated steps of the depicted exemplary embodiment.

In the detailed description that follows, reference is made to the appended drawings, which form a part thereof. It is recognized that the foregoing summary is illustrative only and is not intended to be limiting in any manner. In addition to the illustrative aspects, example embodiments, and features described above, additional aspects, exemplary embodiments, and features will become apparent by reference to the drawings and the detailed description below. The description of elements in each figure may refer to elements of proceeding figures. Like reference numerals may refer to like elements in the figures, including alternate exemplary embodiments of like elements.

Referring now to the drawings in detail and beginning with FIG. 1, there is depicted an exemplary embodiment of a memory system 90 and is an illustration of its main hardware components. In this particular embodiment, the memory system 90 operates and is in communication with a host device 80 through a host interface. Further, the memory system 90 comprises a memory device 102 whose operations are controlled by a controller 100. The host device 80 may comprise any device or system that utilizes the memory system 90 (e.g., a computing device). Accordingly, the memory system 90 may be in the form of a removable memory card or an embedded memory system. For example, the memory system 90 may be embedded in a solid-state drive that is installed in a laptop computer. In another example, the memory system 90 may be embedded within the host device 80 such that the host 80 and the memory system 90 (including controller 100) are formed on a single integrated circuit chip. In embodiments in which the memory system 90 is implemented within a memory card, the host device 80 may include a built-in receptacle for the one or more types of memory cards or flash drives (e.g., a universal serial bus (USB) port, or a memory card slot). Further, the host 80 may use adapters in which a memory card is plugged.

Still referring to FIG. 1, as described in detail below, the memory device 102 may comprise one or more memory arrays of a plurality of non-volatile memory cells that are distributed over one or more integrated circuit chips. And, in accordance with this particular embodiment, the controller 100 may include several components that may include, but are not limited to, interface circuits 110, a processor 120, ROM (read-only memory) 122, RAM (random access memory) 130, programmable non-volatile memory 124, and additional components. The controller 100 may, for example, be in the form of one or more application-specific integrated circuits (ASIC) in which the components included in such an ASIC generally depend on the particular application.

Figure 2:
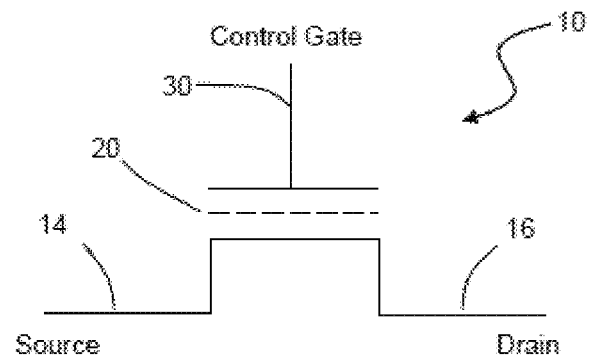
FIG. 2 is a schematic depiction of a non-volatile memory cell, in accordance with exemplary embodiments.

With respect to the memory device 102 itself, FIG. 2 is a schematic depiction of an individual non-volatile memory cell 10 in accordance with an exemplary embodiment. As is mentioned above, the memory cell 10 may be implemented by a field-effect transistor having a charge storage unit 20, such as a floating gate or a dielectric layer. In addition, the memory cell 10 comprises a source region 14 and a drain region 16. Further, a control gate 30 is positioned above the floating gate 20. Example types of non-volatile memory cells having this general structure include, but are not limited to, electrically erasable programmable read-only memory (EEPROM) and flash EEPROM, NAND (NOT-AND)-type cells, and memory devices utilizing dielectric storage elements (e.g., NROM™). In operation, the memory state of a cell (e.g., programmed or erased) may, in accordance with certain embodiments, be read by sensing the conduction current across the source and drain electrodes of the memory cell when a reference voltage is applied to the control gate 30. More specifically, for each given charge on the floating gate 20 of a memory cell, a corresponding conduction current with respect to a fixed reference control gate voltage may be detected. Accordingly, as is described above, the range of charges programmable onto the floating gate defines a corresponding threshold voltage window or a corresponding conduction current window of the memory cell 10. Alternatively, rather than detecting the conduction current among a partitioned current window, it is possible to set the threshold voltage for a given memory state under test at the control gate 30 and detect if the resulting conduction current is higher than or lower than a threshold current (i.e., a cell-read reference current). In one such exemplary implementation, detection of the conduction current relative to a threshold current is accomplished by examining a discharge rate of the conduction current through the capacitance of a bit line.

Figure 3:
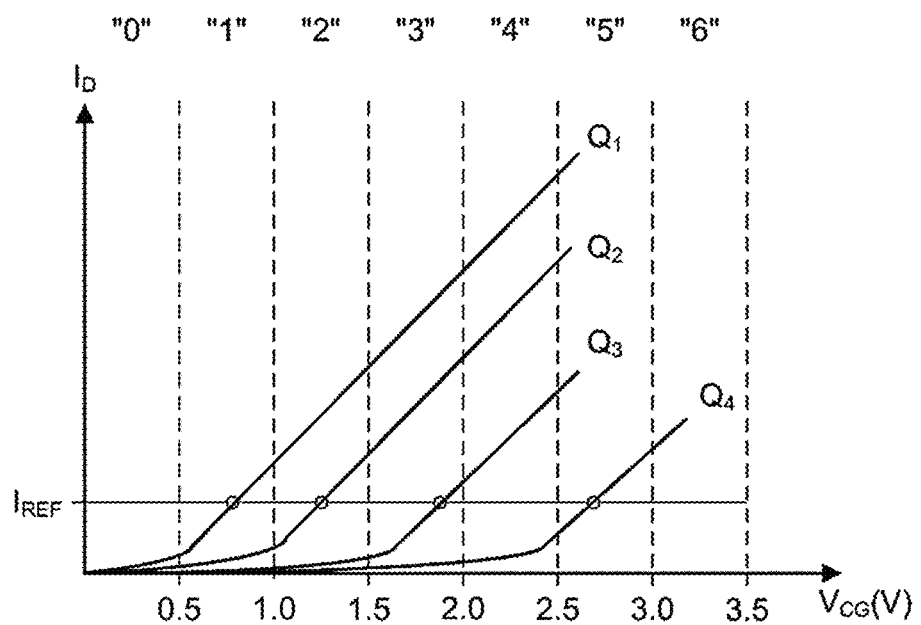
FIG. 3 depicts the relationship between a source-drain current ID and a control gate voltage $V_{CG}$ for four different charges Q1-Q4 that a floating gate of a non-volatile memory cell may be selectively storing at any one time and at a fixed drain voltage, in accordance with exemplary embodiments.

FIG. 3 provides a graphical illustration of the correlation between the source-drain current ID and control gate voltage $V_{CG}$ for, for example, a non-volatile memory cell 10 having four different charge states Q1-Q4 that the floating gate may be selectively storing at any given time. As shown, with a fixed drain voltage bias, there exists four solid ID versus $V_{CG}$ curves representing four charge levels that can be programmed on a floating gate of the memory cell, wherein the four charge levels respectively correspond to four of eight possible memory states. Therefore, as an example, the threshold voltage window of a population of memory cells may range from 0.5 V to 3.5 V. In such an example, seven programmed memory states assigned as "0," "1," "2," "3," "4," "5," "6," respectively, and one erased state (which is not shown in FIG. 3), may be demarcated by partitioning the threshold window into regions at intervals of 0.5 V each. Accordingly, if a reference current, $I_{REF}$, of 2 µA is used as shown, then a cell programmed with Q1 voltage may be considered to be in a memory state "1" as its curve intersects with $I_{REF}$ in the region of the threshold window that is demarcated by the voltage range $V_{CG}$=0.5 V and 1.0 V. Similarly, Q4 is in a memory state "5."

Thus, as mentioned above, the more states that a memory cell 10 is made to store, the more finely divided is its threshold voltage window. For example, in a memory cell 10 that has a threshold voltage window ranging from −1.5 V to 5 V, thereby providing a possible maximum width of 6.5 V, and is to store 16 memory states, each state may only occupy a voltage range of from 200 mV to 300 mV. Such a narrow voltage range will require higher precision in programming and reading operations in order to achieve the required resolution.

Figure 4A:
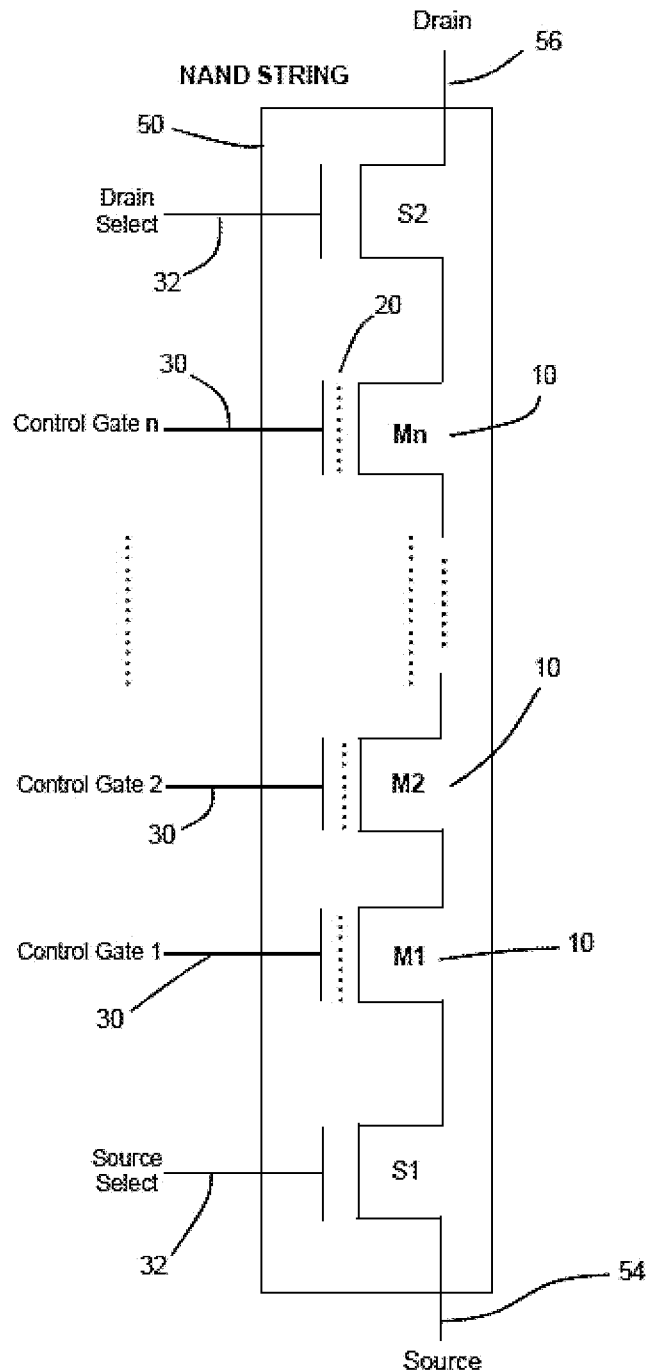
FIG. 4A schematically depicts a series of NAND-type memory cells that are organized into a string, in accordance with exemplary embodiments.

Individual memory cells 10 are organized into strings in which the memory cells are placed in series. For example, depicted in FIG. 4A is an exemplary embodiment of a string 50 comprising NAND-type memory cells in which the series of the cells' respective transistor elements M1, M2, . . . , Mn (wherein "n" may equal 4, 8, 16 or higher) are daisy-chained with respect to their sources and drains. Further, as discussed with respect to FIG. 3, each memory transistor 10 in the string 50 has a charge storage element 20 (e.g., a floating gate) for storing a certain amount of charge so as to represent an intended memory state of that cell. And, as explained in greater detail below, each memory transistor 10 comprises a control gate 30 that allows control over the read and write operations. Present at the source terminal 54 and drain terminal 56 of the string 50 are select transistors S1, S2 that control the transistor elements' connection to the outlying memory array. Specifically, when the source select transistor S1 is turned on, the source terminal 54 is coupled to a source line. Likewise, when the drain select transistor S2 is turned on, the drain terminal 56 is coupled to a bit line of the memory array.

Figure 4B:
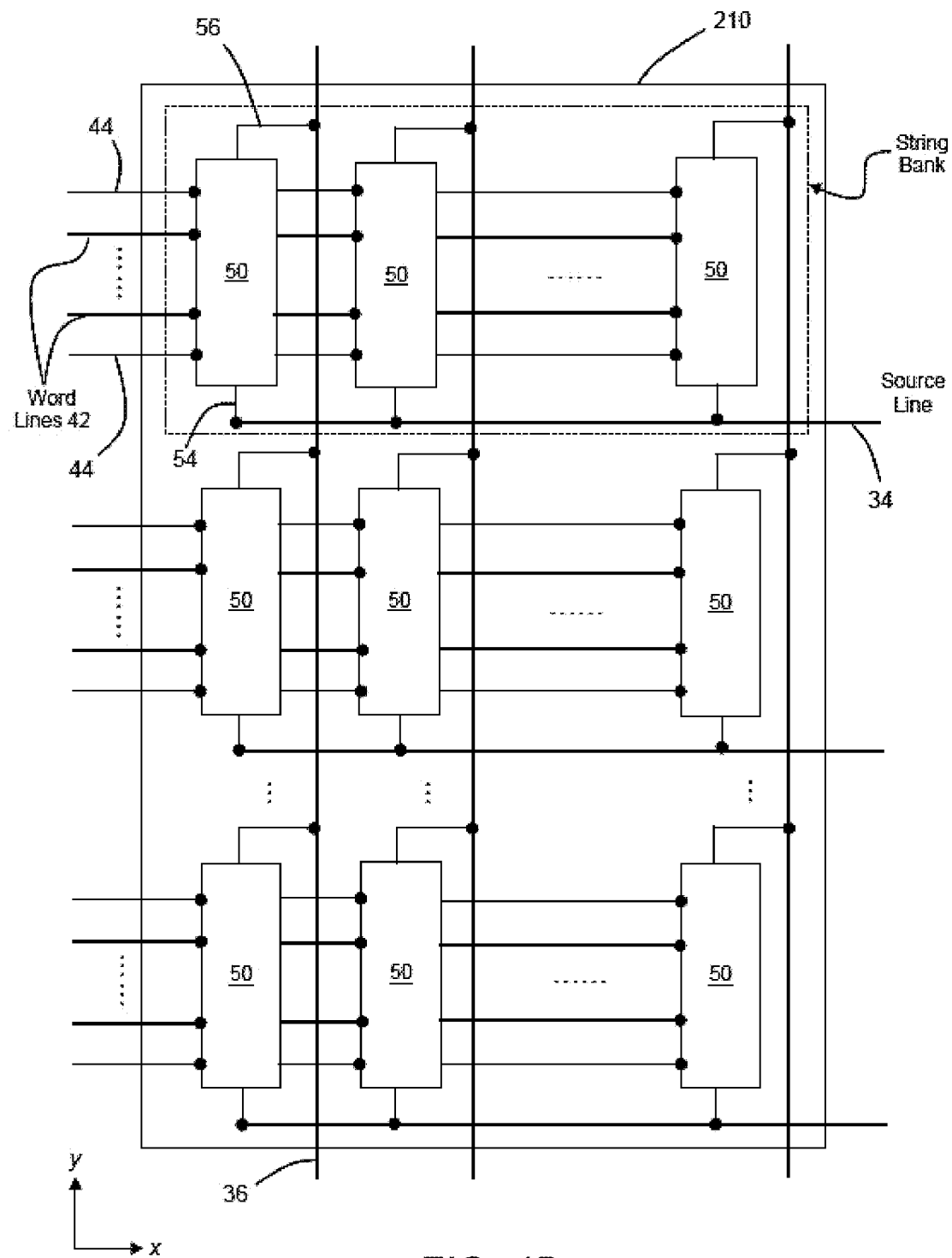
FIG. 4B schematically depicts an array of memory cells, comprising a plurality of NAND-type strings, such as the type depicted in FIG. 4A, in accordance with exemplary embodiments.

Expanding outward a hierarchical level, FIG. 4B is a schematic diagram depicting an exemplary embodiment of a memory array 210 comprised of a plurality of NAND strings 50 of the type illustrated in FIG. 4A. Along each column of NAND strings 50, a bit line 36 is coupled to the drain terminal 56 of each NAND string. In addition, along each bank of NAND strings 50, a source line 34 is coupled to the source terminals 54 of each NAND string. Further, the control gates 30 of the memory transistors 10 in a row of memory cells in the bank of NAND strings 50 are connected to the same word line 42. Accordingly, when an addressed memory transistor 10 within a NAND string 50 is read or verified during a programming operation, an appropriate voltage is applied to its control gate 30. Concurrently, the remaining non-addressed memory transistors 10 within the NAND string 50 are fully turned on by applying a sufficient voltage to their respective control gates 30. As a result, a conductive pathway is created from the source of the addressed memory transistor 10 to the source terminal 54 of NAND string 50, and from the drain of the addressed memory transistor 10 to the drain terminal 56 of the cell.

Further, the control gates 32 of the select transistors S1, S2 of each NAND string 50 in the memory array 210 provides control access to the NAND string at its source terminal 54 and drain terminal 56. The control gates 32 of the select transistors S1, S2 along a row in a bank of NAND strings 50 are connected to the same select line 44. Thus, an entire row of memory cells 10 in a bank of NAND strings 50 can be addressed by applying the appropriate voltages on the word lines 42 and select lines 44 of the bank of NAND strings 50.

Figure 5:
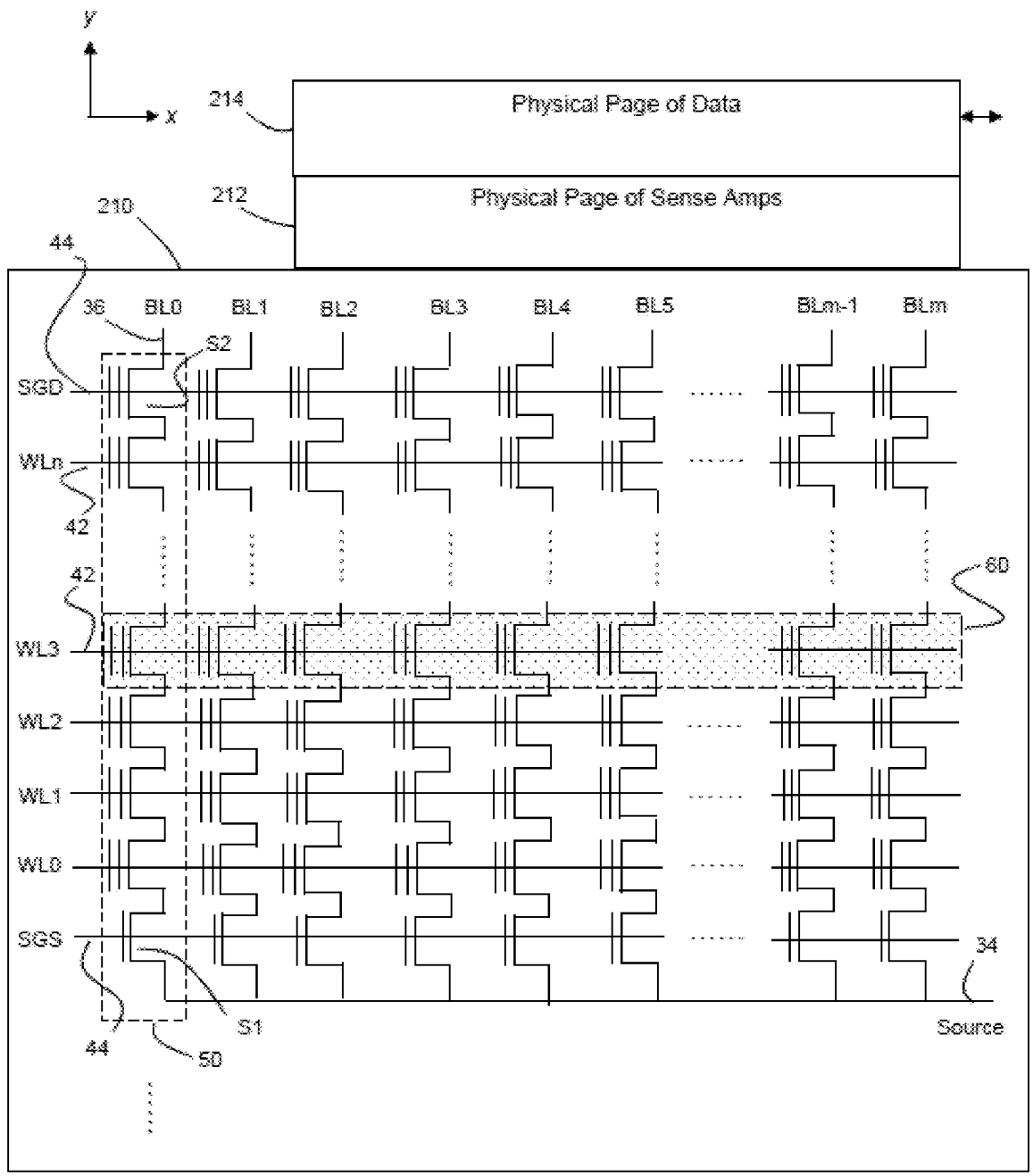
FIG. 5 depicts a page of memory cells being sensed or programmed in parallel, and in relation to a memory array organized in the NAND-type configuration, in accordance with exemplary embodiments.

Turning now to FIG. 5, there is depicted a detailed illustration of one bank of NAND strings 50 of a memory array 210 according to an exemplary embodiment thereof. This view is particularly useful in visualizing a row-by-row configuration of the memory array 210, wherein each row of the array 210 may be referred to as a "page." Accordingly, a physical page (such as page 60 denoted in FIG. 5) is a group of memory cells 10 that is enabled to be sensed or programmed in parallel. In fact, a page is the smallest unit of the memory device that may be programmed or written to. Programming of a page is accomplished by a corresponding page of sense amplifiers 212, wherein each sense amplifier may be coupled to a respective NAND string 50 via a bit line (e.g., see respective bit lines BL0, BL1, BL2, BL3, BL4, BL5, . . . , BLm−1, and BLm illustrated in FIG. 5). Thus, a page 60 is enabled by the control gates of the plurality of memory cells 10 in page 60, which are connected to a common word line 42, and each memory cell 10 of the page 60 is accessible by a sense amplifier via a bit line 36. Therefore, when programming or sensing a page 60 of memory cells 10, a programming or sensing voltage is respectively applied to the common word line (e.g., word line WL3 with respect to the page 60) together with appropriate voltages on the bit lines.

Regarding the manner in which data is programmed and erased, it is important to note that, with respect to flash memory, a memory cell must be programmed from an erased state. In other words, a floating gate 20 must first be emptied of charge, thereby placing the memory cell in an erased state, before a programming operation can subsequently add a desired amount of charge back to the floating gate 20. Thus, the level of charge on a floating gate 20 cannot be incrementally increased or decreased from its previous programmed level. Therefore, it is not possible for update data to overwrite the existing data of a memory cell 10. Rather, the update data must be programmed to a previous unwritten location.

For purposes of promoting performance in erase operations, an array 210 of memory cells 10 is, for example, divided into a large number of blocks of memory cells, wherein a block is the smallest unit of the memory device in which the memory cells contained may be erased together. Furthermore, each block of memory cells 10 may be divided into a number of physical pages 60 wherein, as mentioned above, a programming operation is conducted page by page. Accordingly, a logical page is a unit of programming or reading that contains a number of bits equal to the number of memory cells 10 in a given physical page. For example, in a memory device of the SLC-type in which one bit of data is stored in each memory cell 10, one physical page 60 stores one logical page of data. Accordingly, in a memory device of the MLC-type in which two bits of data are stored in each memory cell 10, one physical page 60 can store two logical pages of data. As such, one or more logical pages of data are typically stored in one row (i.e., page 60) of memory cells. A page 60 can store one or more sectors wherein a sector is comprised of both user data and overhead data. In an exemplary embodiment, individual pages 60 may be divided into segments in which each segment contains the fewest number of memory cells 10 that may be written at one time in a basic programming operation.

Figure 6:
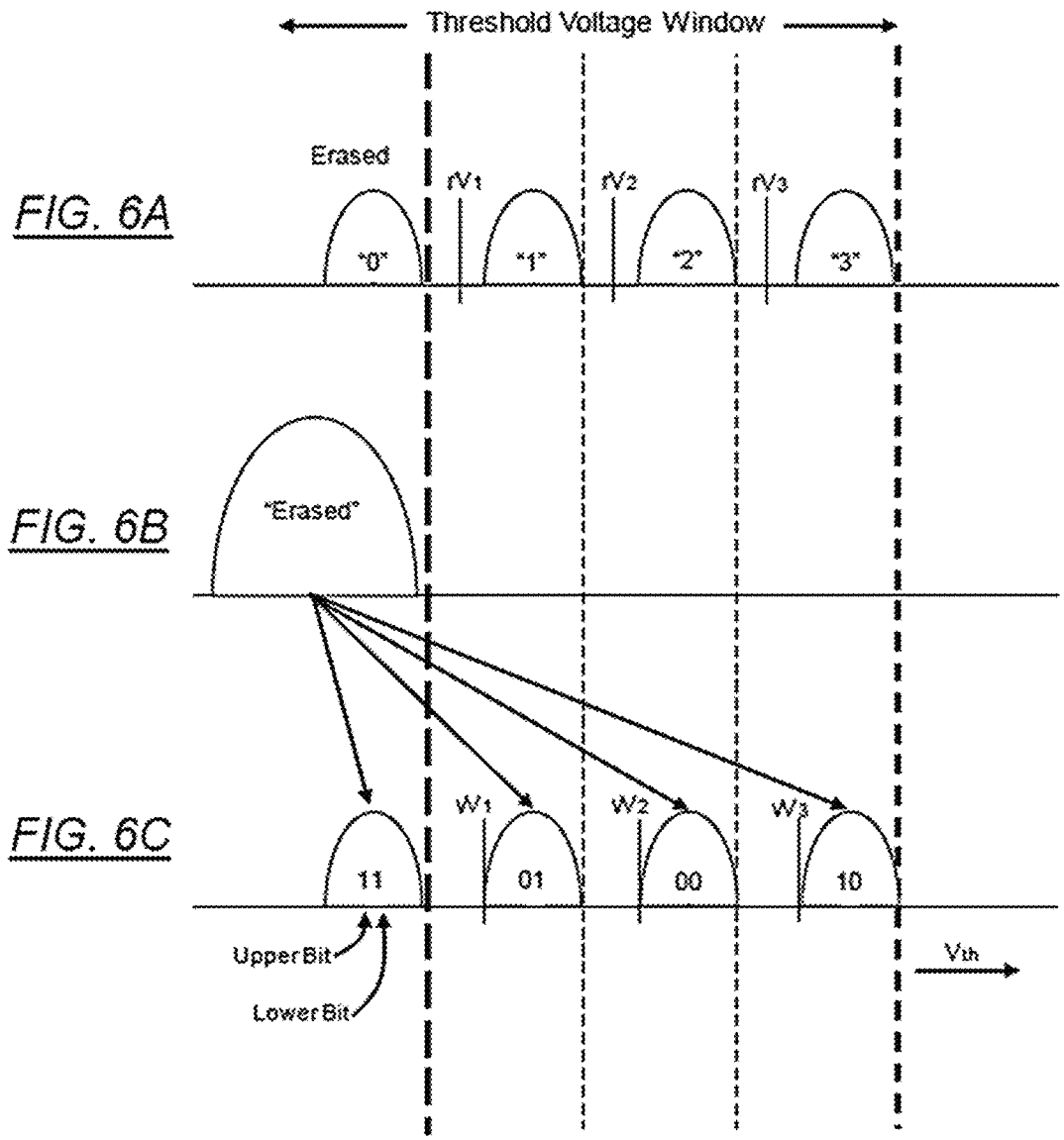
FIGS. 6A-6C depict stages of programming four states of a population of MLC NAND-type memory cells, in accordance with exemplary embodiments.

To illustrate an exemplary embodiment of the programming stages of a MLC-type memory device comprising a population of four-state memory cells, reference is made to FIGS. 6A-6C. In FIG. 6A, there is depicted a population of memory cells in which the characteristic threshold voltage window is divided into four distinct voltage distributions wherein each distribution corresponds to a programmable memory state (i.e., memory states "0," "1," "2," and "3"). FIG. 6B illustrates an initial distribution of "erased" threshold voltages for an erased memory. In FIG. 6C, much of the memory cell population is programmed such that the initial "erased" threshold voltage of a given memory cell 10 is moved to a higher value into one of the three divided voltage zones demarcated by verify levels $vV_1$, $vV_2$, and $vV_3$. Accordingly, each memory cell can be programmed to one of the three programmable states "1," "2," and "3," or remain in the "erased" state. On a bit level, a 2-bit code having a lower bit and an upper bit can be used to represent each of the four memory states. For example, as depicted in FIG. 6C, the memory states "0," "1," "2," and "3" may be assigned bit values "11," "01," "00," and "10" respectively. In such an example, the 2-bit data may be read from the memory by sensing in a "full-sequence" mode where the two bits are sensed together by sensing relative to the corresponding read demarcation threshold voltages $rV_1$, $rV_2$, and $rV_3$ in three sub-passes respectively.

Figure 7:
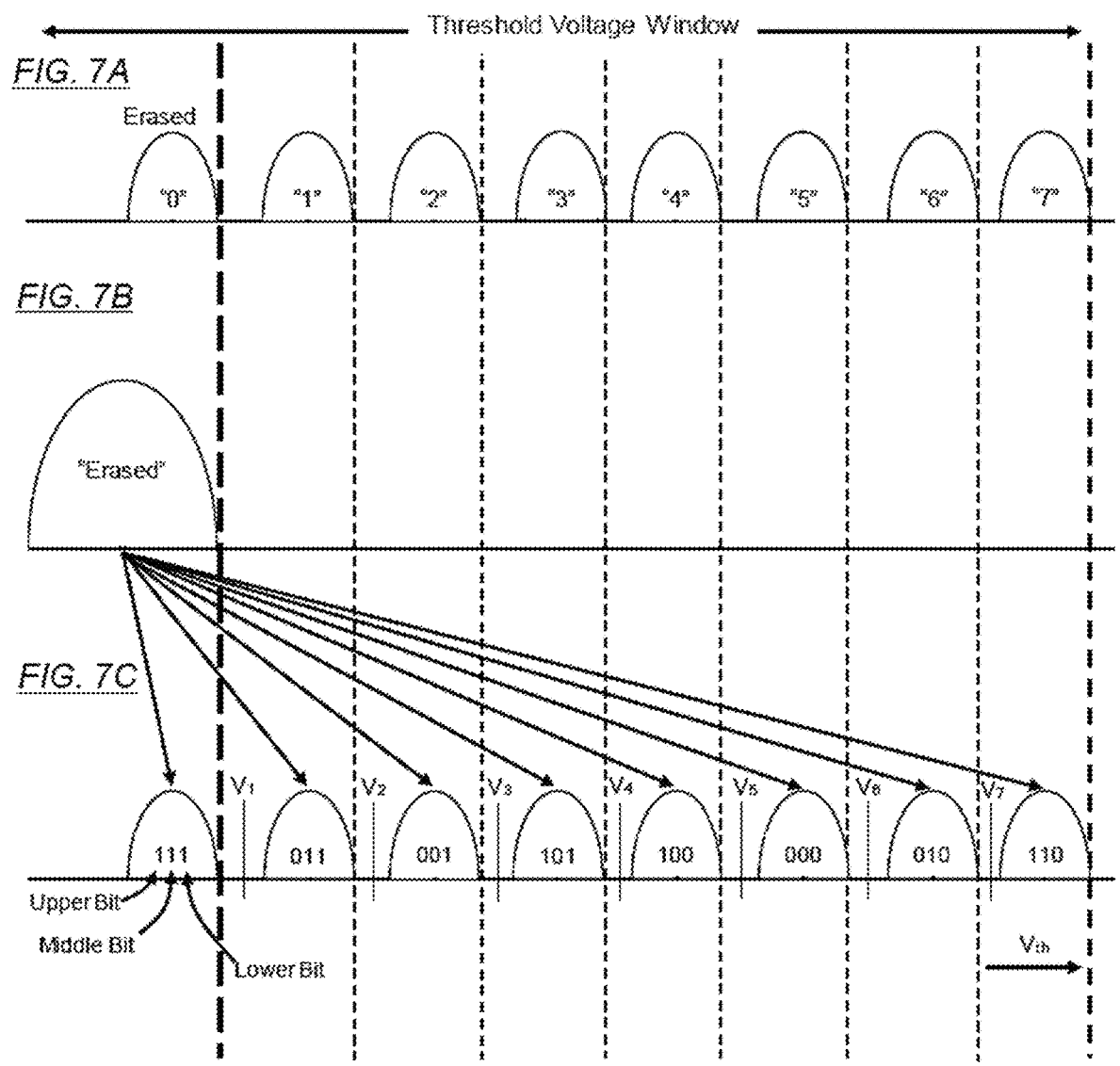
FIGS. 7A-7C depict stages of programming eight states of a population of TLC NAND-type memory cells, in accordance with exemplary embodiments.

Similarly, FIGS. 7A-7C illustrate programming stages of a TLC-type memory device comprising a population of eight-state memory cells, each cell being programmable into eight distinct distributions of threshold voltages that, in accordance with this particular embodiment, represent memory states "0," "1," "2," "3," "4," "5," "6," and "7," respectively (as shown in FIG. 7A). Thus, FIG. 7B depicts an initial distribution of "erased" threshold voltages for an erased memory. Further, FIG. 7C depicts an example of the memory after many of the memory cells have been programmed. As a result, a cell's threshold voltage is moved higher into one of the distinct voltage ranges demarcated by levels $V_1$, $V_2$, $V_3$, $V_4$, $V_5$, $V_6$, and $V_7$. Accordingly, each memory cell can be programmed to one of the seven programmed states "1" through "7," or can remain unprogrammed in the "erased" state. As a consequence of the programming, the initial distribution of the "erased" state as shown in FIG. 7B becomes narrower as indicated by the "0" state in FIG. 7C. In this case, a 3-bit code having lower, middle, and upper bits can be used to represent each of the memory states (i.e., "111," "011," "001," "101," "100," "000," "010," and "110") and the 3-bit data may also be read from the memory by sensing in the "full-sequence" mode where the three bits are sensed together by sensing relative to the demarcation threshold values V1 through V7 in seven sub-passes respectively.

Figure 8:
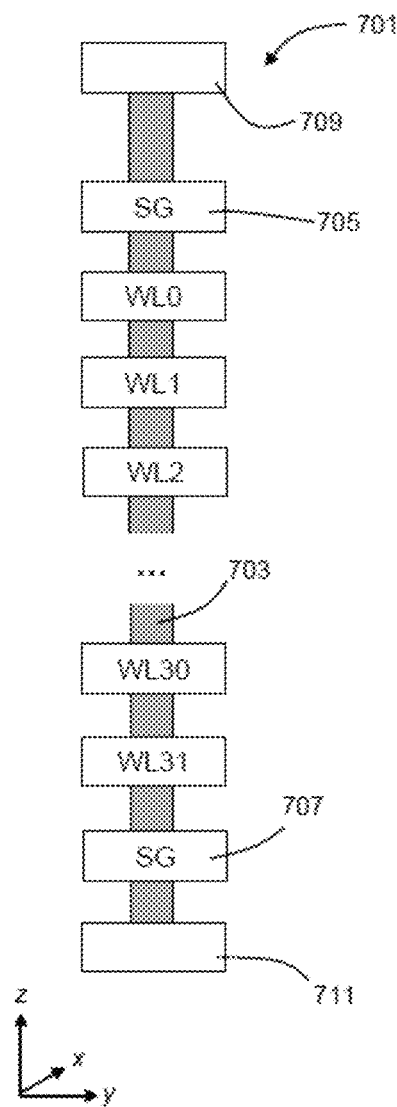
FIG. 8 depicts a vertical NAND-type string in accordance with an exemplary embodiment.

In FIGS. 4A-4B and 5 and the foregoing corresponding discussion, there is generally described a two-dimensional (or planar) memory array 210 (lying in a x-y plane, for example), which may comprise NAND-type memory cells. However, in an alternative configuration, a memory array may be in the form of a three-dimensional array that, unlike being formed on a planar surface of a semiconductor wafer, the array extends upwards from the wafer surface and comprises stacks or columns of memory cells extending vertically in an upwards direction (for example, in a z direction that is perpendicular to the x-y plane). For example, in FIG. 8 there is depicted an exemplary embodiment of a NAND-type string 701, which is operated in a similar manner as a planar two-dimensional NAND-type string (such as the NAND-type string 50 described above). In this configuration, a memory cell is formed at the juncture of a vertical bit line (see e.g., local bit line 703) and a word line (see e.g., word lines WL0, WL1, etc.), wherein a charge trapping layer located between the local bit line 703 and an intersecting word line stores charge (which dictates the threshold voltage of the transistor formed by the word line—gate—coupled to the vertical bit line—channel—that it encircles). To form such a vertical string 701, stacks of word lines are formed and memory holes are etched at the appropriate locations where cells are to be formed, wherein each memory hole is lined with a charge trapping layer and filled with a suitable local bit line/channel material. Dielectric layers are included for the necessary isolation. Further, located at either end of the NAND-type string 701 are select gates 705, 707, which allow for the selective connection to, or isolation from, external elements 709, 711 that include, for example, conductive lines such as common source lines or bit lines that serve large numbers of strings 701 of an array. In the particular embodiment shown in FIG. 8, the vertical NAND-type string 701 has 32 memory cells (i.e., at the juncture between local bit line 703 and word lines 0 through 31) connected in series. However, a NAND-type string 701 may comprise any suitable number of memory cells.

As described above, memory cells of the memory structure 200 may be arranged in a single memory device level in an ordered two-dimensional array of a plurality of rows and/or columns. Alternatively, a three-dimensional memory array may be arranged such that memory cells occupy multiple planes or multiple memory device levels, thereby forming a structure that has three dimensions (e.g., in the x, y, and z directions, wherein the z direction is substantially perpendicular and the x and y directions are substantially parallel to the major surface of the semiconductor substrate). In some exemplary embodiments, a three-dimensional memory structure 200 may be vertically arranged as a stack of multiple two-dimensional memory array device levels. In other exemplary embodiments, the three-dimensional memory structure 200 is arranged as multiple vertical columns (wherein each column extends substantially perpendicular to the major surface of the substrate, i.e., in the z direction) with each column having multiple memory cells. In this example, the vertical columns may be arranged in a two-dimensional configuration (i.e., in the x-y plane), thereby forming a three-dimensional arrangement in which the memory cells are on multiple vertically stacked memory planes. Other configurations of memory elements in three dimensions can also constitute a three-dimensional memory array. However, generally speaking, a three-dimensional NAND array may be constructed by tilting a two-dimensional memory structure, such as structures 50 and 210 of FIGS. 4A-B and 5, respectively, in the vertical direction that is perpendicular to the x-y plane (i.e., the z direction), such that each y-z plane of the three-dimensional structure corresponds to the page structure of FIG. 5, wherein each plane is at differing locations along the x axis. As a result, the global bit lines (e.g., BL0, . . . , BLm, of FIG. 5) each run across the top of the memory structure to an associated sense amplifier (e.g., SA0, . . . , SAm). Accordingly, the word lines (e.g., WL0, . . . , WLn, of FIG. 5), and the source and select lines (e.g., SSL0, . . . , SSLn, and DSL0, . . . , DSLn, respectively) extend in the x direction, with the bottom of each NAND string (e.g., string 50) connected to a common source line.

Figure 9:
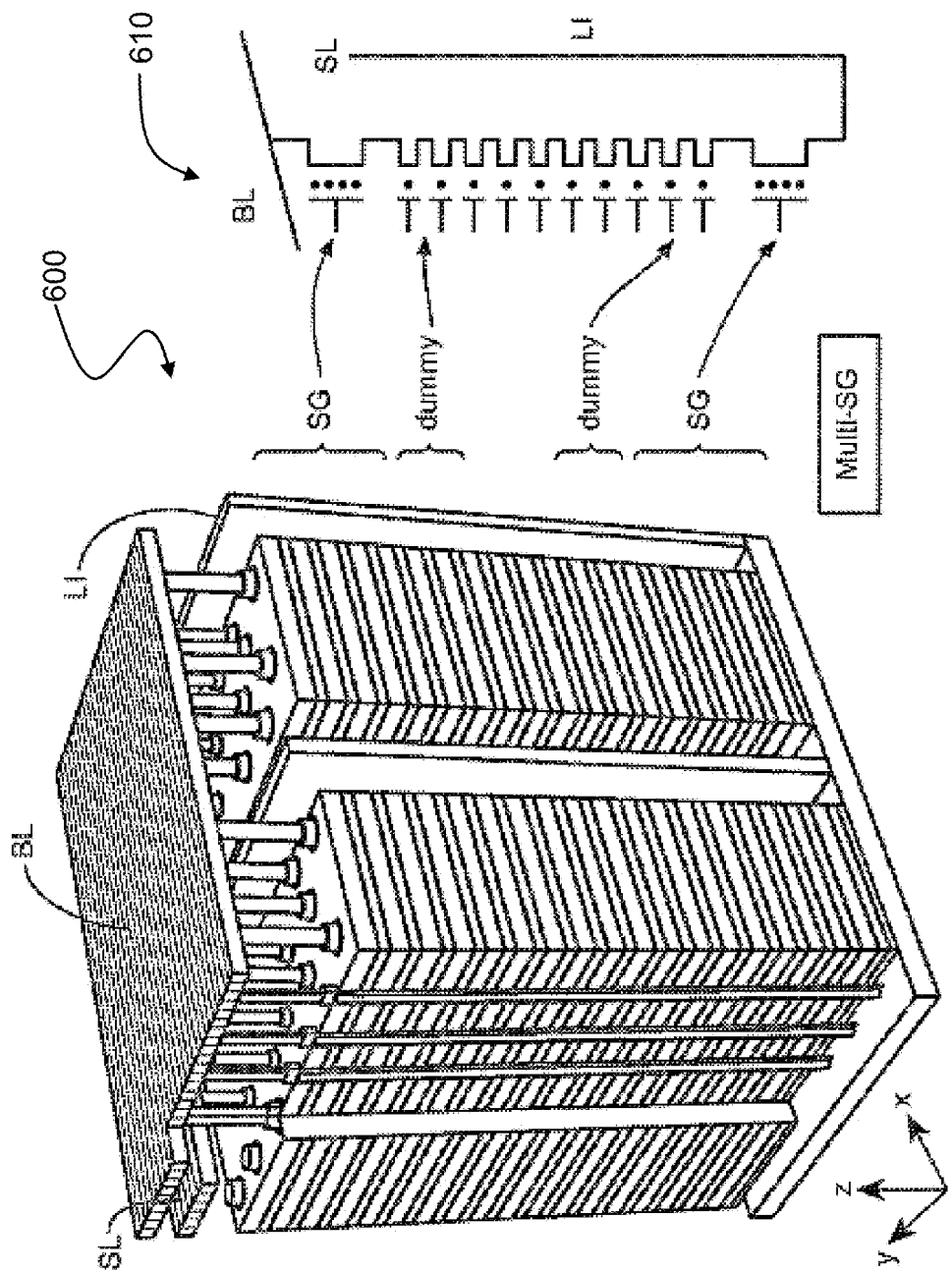
FIG. 9 is a perspective view of a representative subsection of a monolithic three-dimensional NAND-type memory array, in accordance with exemplary embodiments.

Referring now to FIG. 9, there is depicted an oblique perspective view of an example subsection of an embodiment of a three-dimensional NAND memory array 600 of the Bit Cost Scalable ("BiCS") type in which one or more memory device levels is formed above a single substrate. The example subsection corresponds to two of the page structures shown in FIG. 4B wherein, depending upon the particular embodiment, each may correspond to a separate memory block or may be different extensions of the same block. According to this embodiment, rather than lying in the same y-z plane, the NAND strings are pressed in the y-direction such that the NAND strings have a staggered configuration in the x-direction. Further, at the top of the array 600, the NAND strings are connected along global bit lines (BL) that span multiple of these subsections of the array 600 that run in the x-direction. In addition, global common source lines (SL) also run across multiple subsections of the memory array 600 in the x-direction and are connected to the sources at the bottom of the NAND strings by a local interconnect (LI) that operates as the local common source line of the individual extension. However, dependent upon the embodiment, the global source lines (SL) can span the whole, or just a subsection, of the memory array 600. Depicted on the right side of FIG. 9 is a schematic representation of the fundamental elements of one of the vertical NAND strings 610 of the memory array 600. Similar to the NAND string 50 of FIG. 4A, the string 610 is comprised of a series of interconnected memory cells. The string 610 is connected to an associated bit line (BL) through a drain select gate (SGD). A source select gate (SDS) connects the string 610 to a global source line (SL) through an associated local source line (LI). Further included in this particular embodiment are several dummy cells located at the ends of the string 610. Due to their proximity to select gates (SGD, SDS) and, thereby, their susceptibility to disturbs, the dummy cells are not used to store user data.

Figure 10:
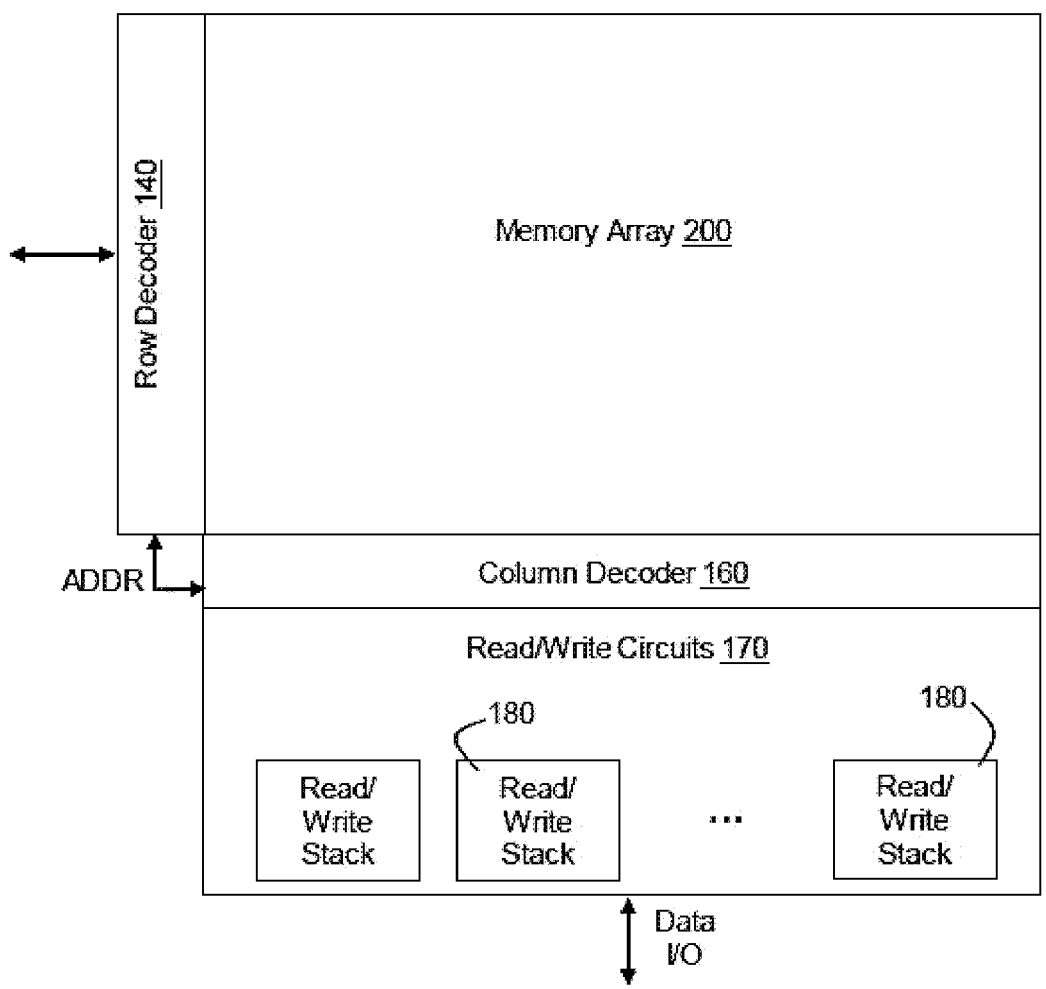
FIG. 10 schematically depicts a configuration of a non-volatile memory array that is accessible by read/write circuits via row and column decoders, in accordance with exemplary embodiments.
Figure 11:
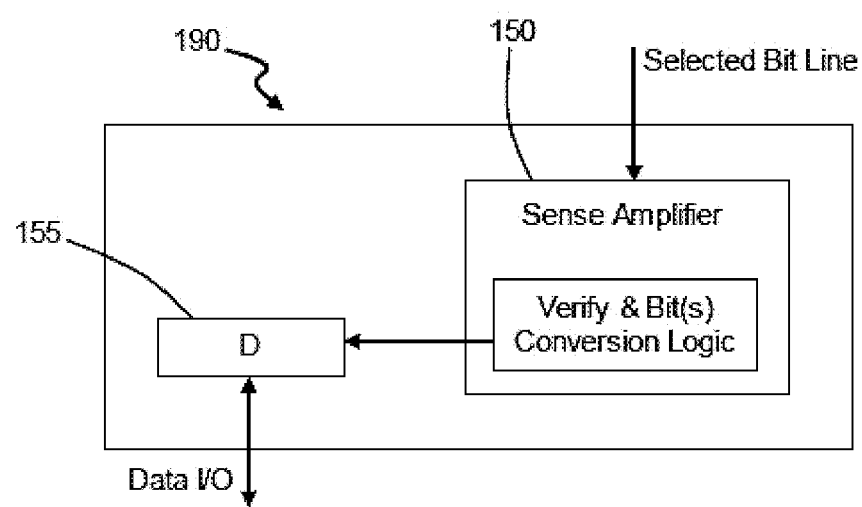
FIG. 11 is a block diagram of an individual read/write module, in accordance with an exemplary embodiment.

Referring back to the overall architecture of a memory system that is, for example, depicted in FIG. 1, a schematic depiction of a typical arrangement of a memory array of such a system is illustrated in FIG. 10. In this exemplary embodiment, there is shown a non-volatile memory array 200 that is accessible by read/write circuits 170 by way of row decoder 140 and column decoder 160. As previously described above, individual memory cells of the memory array 200 are addressable via a set of selected word line(s) and bit line(s). Accordingly, the row decoder 140 selects one or more word lines and the column decoder 160 selects one or more bit lines in order to apply the appropriate voltages to the respective gates of the addressed memory cells. Further, read/write circuits 170 are provided to read or write the memory states of the addressed memory cells, wherein the read/write circuits 170 comprise a number of read/write modules connectable via bit lines to the memory elements of the array 200. A schematic block diagram of such a read/write module 190 is provided in FIG. 11, according to an exemplary embodiment thereof. In operation, during a read or verify step, a sense amplifier 150 determines the current that is flowing through the drain of an addressed memory cell that is connected via a selected bit line. The level detected by the sense amplifier 150 is converted by a level-to-bits conversion logic to a set of data bits to be stored in a data latch 155. Now referring back to FIG. 10, the read/write circuits 170 are organized into banks of read/write stacks 180 wherein each read/write stack 180 is a stack of read/write modules 190.

Figure 12A:
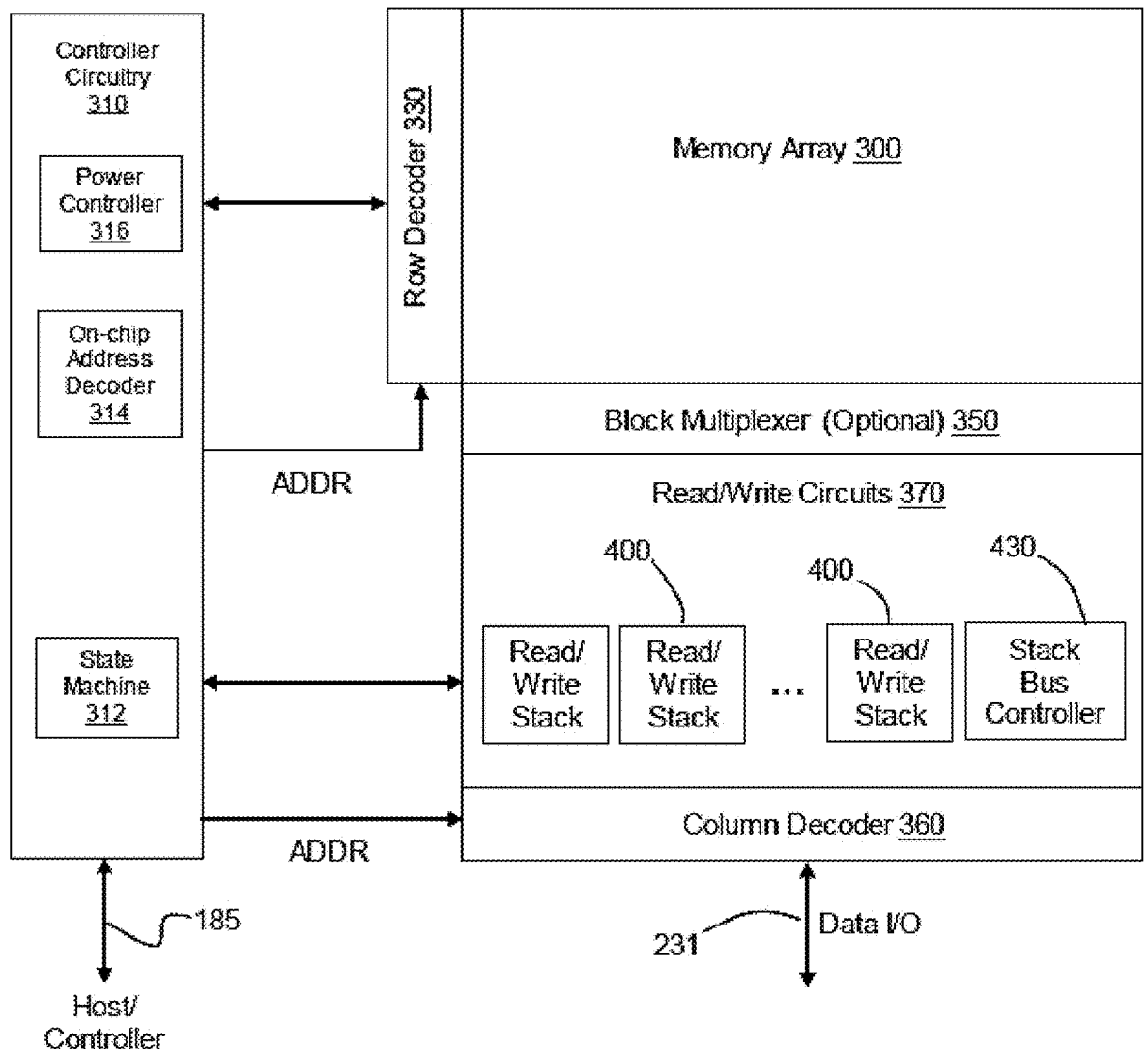
FIG. 12A schematically depicts a memory device with a bank of partitioned read/write stacks, in accordance with exemplary embodiments.

Referring now to FIG. 12A, there is shown an exemplary embodiment of a memory device (such as memory device 102 in FIG. 1, for example) that is comprised of a non-volatile memory array 300 (which may include the NAND-type SLC, MLC, TLC, and/or QLC memory cells that are in a two- or three-dimensional configuration), control circuitry 310, and read/write circuits 370. Further, as is depicted, read/write circuits 370 are comprised of one or more banks of partitioned read/write stacks 400, thereby allowing a block (or "page") of memory cells to be read or programmed in parallel wherein, according to an exemplary embodiment, a "page" of memory cells constitutes a contiguous row of memory cells. Memory array 300 is addressable by word lines via row decoder 330 and by bit lines via column decoder 360. Alternatively, the memory array 300 may comprise rows of memory cells partitioned into multiple blocks or pages. Hence, in such an exemplary embodiment, a block multiplexer 350 is provided to multiplex the read/write circuits 370 to the individual blocks.

With respect to the control circuitry 310, it operates in conjunction with the read/write circuits 370 to perform memory operations on the memory array 300. In this particular embodiment, the control circuitry 310 includes a state machine 312, an on-chip address decoder 314, and a power controller 316. The state machine 312 provides chip level control of memory operations. The on-chip decoder 314 provides an address interface between that that is used by the host or a memory controller to the hardware address used by the decoders 330, 360. Lastly, the power controller 316 controls the power and voltages that are supplied to the word lines and bit lines during memory operations.

Figure 12B:
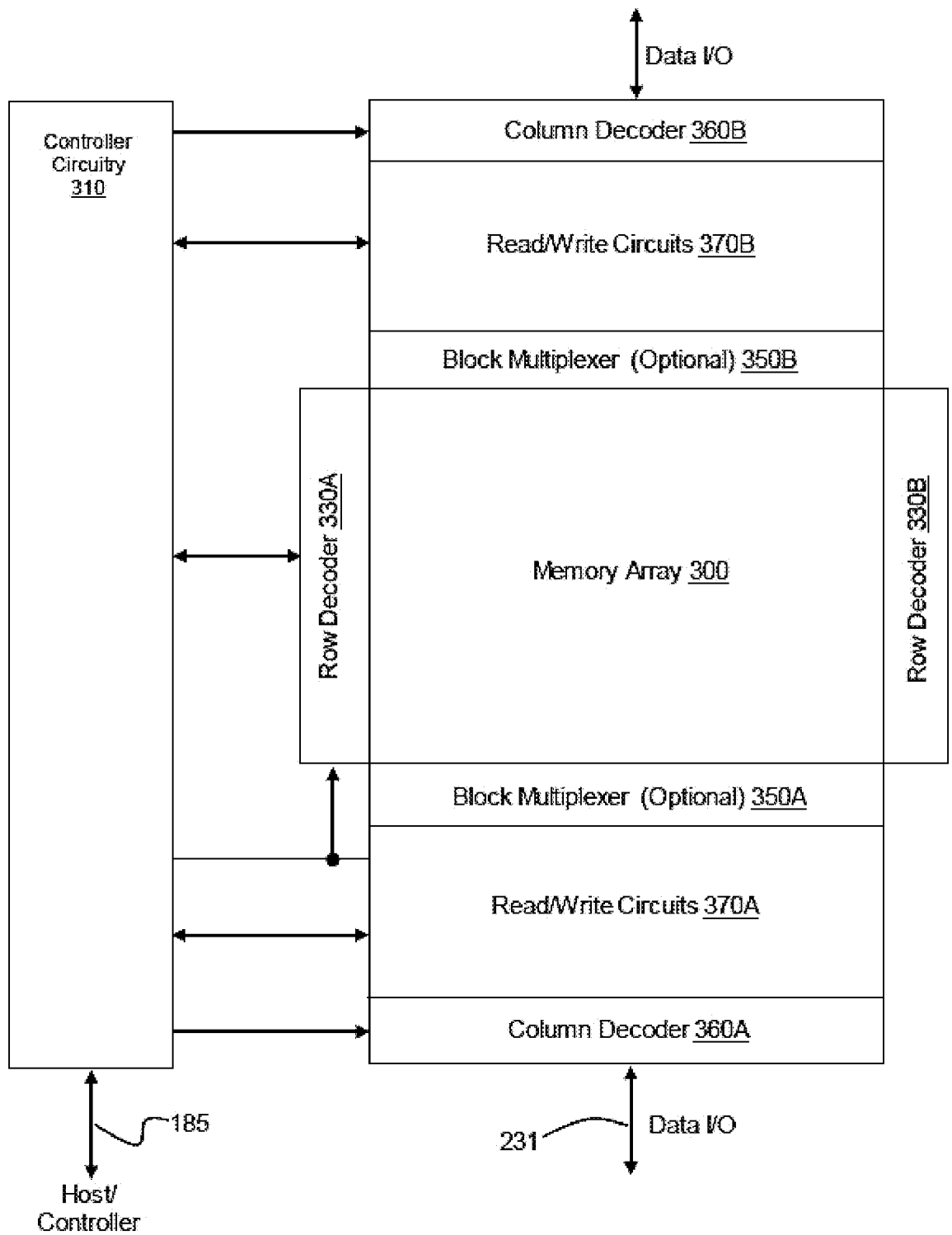
FIG. 12B schematically depicts the memory device of FIG. 11A in a slightly different configuration, in accordance with exemplary embodiments.

FIG. 12B depicts a slightly different exemplary embodiment of the memory device of FIG. 12A. In this particular embodiment, access to memory array 300 by the various peripheral circuits is implemented in a symmetrical manner on opposite sides of the memory array 300. As a result, the access lines and circuitry on each side of the memory array 300 are reduced in half when compared to the configuration in FIG. 12A. Specifically, the row decoder 330 is split into multiple row decoders 330A, 330B, and the column decoder 360 is split into multiple column decoders 360A, 360B. Furthermore, in such an embodiment in which a row of memory cells is partitioned into multiple blocks, block multiplexer 350 is split into multiple block multiplexers 350A, 350B. The read/write circuits 370 are likewise divided into read/write circuits 370A (connecting to bit lines from the bottom of memory array 300) and read/write circuits 370B (connecting to bit lines from the top of memory array 300). Accordingly, the density of the read/write modules (as well as the partitioned read/write stacks 400) is, in essence, reduced by half.

Figure 13:
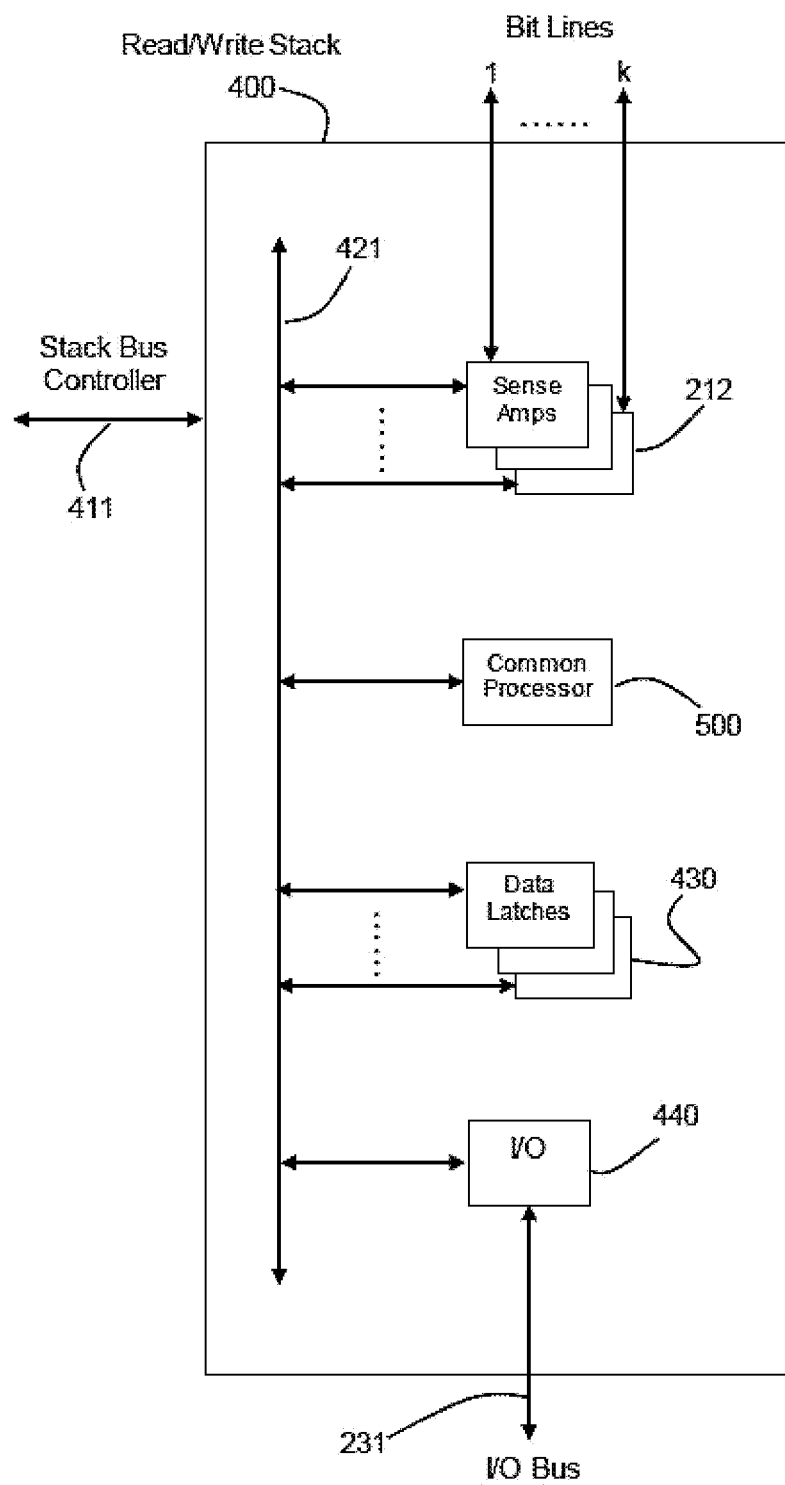
FIG. 13 schematically depicts various components of a read/write stack, such as the read/write stacks depicted in FIG. 11A, in accordance with exemplary embodiments.
Figure 14A:
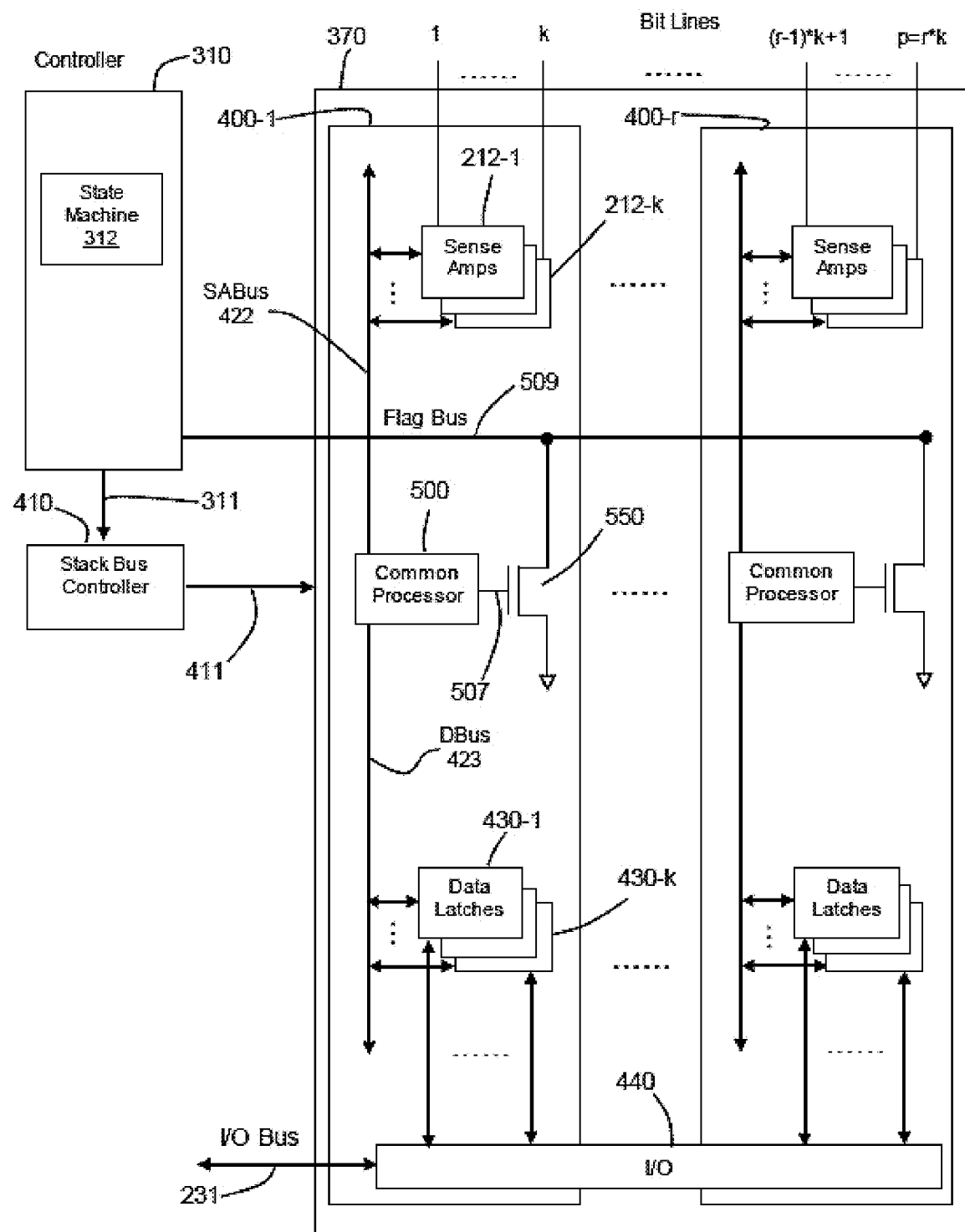
FIG. 14A schematically depicts a plurality of read/write stacks arranged amongst read/write circuits of a memory device, such as the memory device depicted in FIG. 11A, in accordance with exemplary embodiments.

Referring now to FIG. 13, there is illustrated an exemplary embodiment of certain components in a read/write stack, such as the read/write stacks 400 of FIG. 12A. According to this particular architecture, a read/write stack 400 comprises a stack of sense amplifiers 212 for sensing a "k" number of bit lines, an I/O module 440 for input or output of data over an I/O bus 231, a stack of data latches 430 for storing input and/or output data, a common processor 500 to process and store data among the read/write stack 400, and a stack bus 421 for communication among the read/write stack 400 components. In addition, a stack bus controller provides control and timing signals via lines 411 for controlling the various components of read/write stack 400. FIG. 14A depicts an exemplary embodiment for incorporating the read/write stack 400 of the embodiment of FIG. 13 amongst the read/write circuits 370 of the memory devices depicted in FIGS. 12A-12B. As indicated above, each of read/write stacks 400 operates on a group of "k" number bit lines in parallel. Therefore, if a page in memory array 300 has p=r*k bit lines, there will be a "r" number of read/write stacks—i.e., read/write stacks 400-1, . . . , 400-r. Accordingly, the entire bank of partitioned read/write stacks 400-1, . . . , 400-r, operating in parallel allows a block (or a page) of p cells along a row to be read or programmed in parallel, there being p read/write modules for the entire row of cells. As each read/write stack 400-1, . . . , 400-r serves "k" memory cells, the total number of read/write stacks in a bank may be expressed as r=p/k. Further, in accordance with this example, each read/write stack correspondingly has a stack of sense amplifiers 212-1, . . . , 212-k that serves a segment of "k" memory cells in parallel. In addition, each read/write stack correspondingly has a stack of data latches 430-1, . . . , 430-k, wherein each data latch is associated with a memory cell. As such, there is an I/O module 440 enabling data latches 430-1, . . . , 430-k to exchange data externally via an I/O bus 231.

Still referring to FIG. 14A, there is also shown a stack bus controller 410 that receives signals from the memory controller 310 (via lines 311) and in turn provides control and timing signals to the read/write circuits 370 via lines 411. Communication among the read/write stacks 400 is implemented by an interconnecting stack bus controlled by stack bus controller 410. Therefore, the control lines 411 provide control and clock signals from the stack bus controller 410 to the components of the read/write stacks 400-1, . . . , 400-r. In this particular example, the interconnecting stack bus is divided into a SABus 422 and a DBus 423, wherein SABus 422 provides for communication between the common processor 500 and the stack sense amplifiers 212-1, . . . , 212-k, and the DBus 423 provides a communication pathway between the common processor 500 and the stack of data latches 430-1, . . . , 430-k. With respect to the common processor 500, it further comprises an output 507 for output of a status signal of a memory operation, such as an error condition. As is depicted in FIG. 14A, this status signal may, for example, be used to drive a gate of a n-transistor 550 that is tied to a Flag Bus 509 in a Wired-Or configuration, wherein the Flag Bus 509 is pre-charged by the controller 310 and is pulled down when a status signal is asserted by any of read/write stacks 400-1, . . . , 400-r.

Figure 14B:
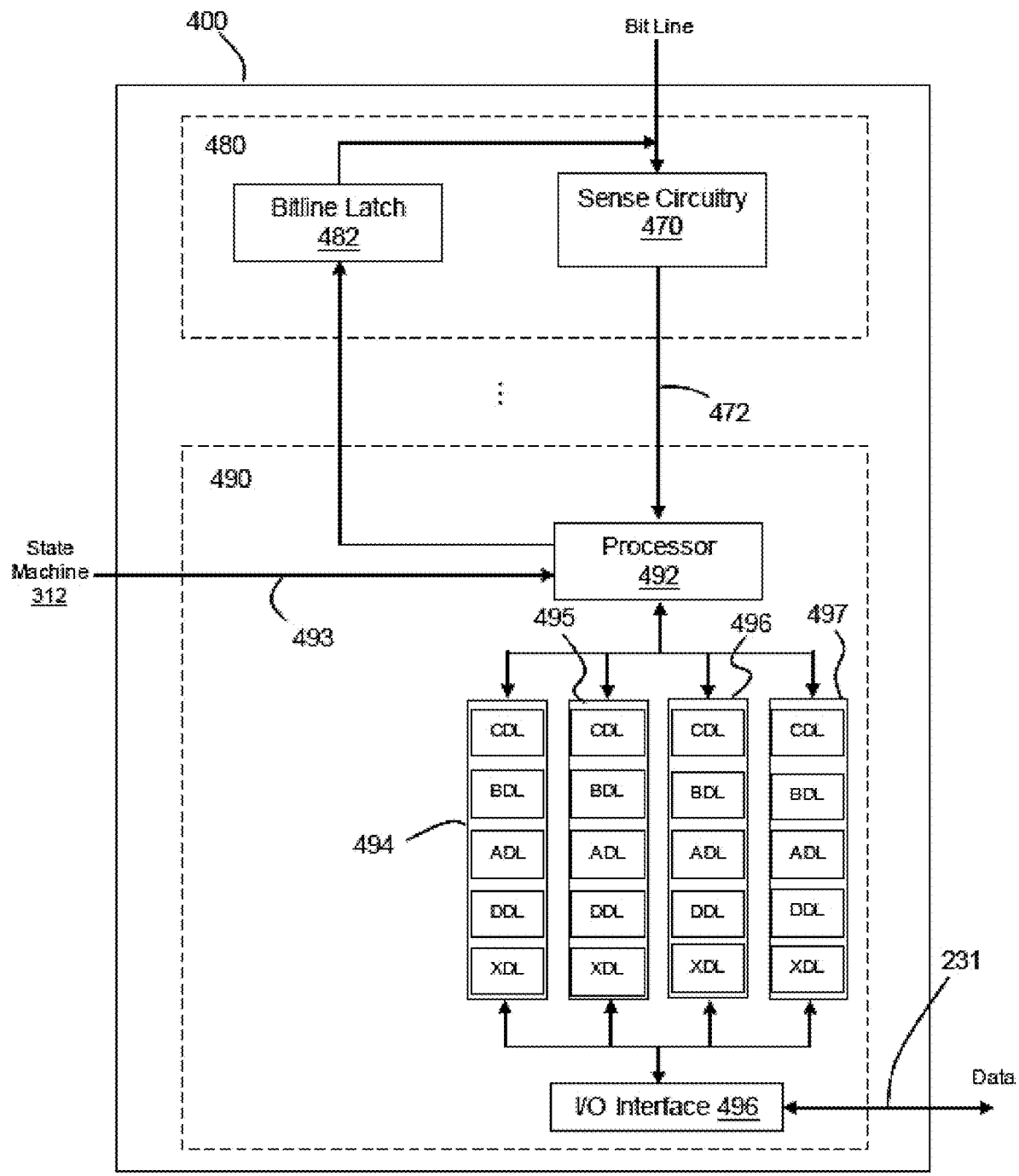
FIG. 14B is a block diagram depicting a sense block of a read/write stack, such as the read/write stacks depicted in FIG. 11A, in accordance with exemplary embodiments.

Further, an exemplary embodiment of an individual sense block (as encompassed by a read/write stack 400) is depicted in FIG. 14B. Sense block 400 is partitioned into one or more core portions comprising the sense modules 480 or sense amplifiers, and a common portion, referred to as a managing circuit 490. In one embodiment, there is a separate sense module 480 for each bit line and one common managing circuit 490 for a set of multiple, e.g., four or eight, sense modules 480. Each of the sense modules in a group communicates with the associated managing circuit via data bus 472. Thus, there are one or more managing circuits which communicate with the sense modules of a set of storage elements 10.

Sense module 480 comprises sense circuitry 470 that performs sensing by determining whether a conduction current in a connected bit line is above or below a predetermined threshold level. Sense module 480 also includes a bit line latch 482 that is used to set a voltage condition on the connected bit line. For example, a predetermined state latched in bit line latch 482 will result in the connected bit line being pulled to a state designating program inhibit (e.g., 1.5-3 V). As an example, a flag=0 can inhibit programming, while flag=1 does not inhibit programming.

In the exemplary embodiment of FIG. 14B, the managing circuit 490 comprises a processor 492, four example sets of data latches 494, 495, 496, and 497, and an I/O interface 496 coupled between the sets of data latches 494-497 and the data bus 231. One set of data latches may be provided for each sense module 480, and data latches identified by XDL, DDL, ADL, BDL, and CDL may be provided for each set. In some cases, additional data latches may be used. In one exemplary approach, in a memory device which uses eight data states, XDL stores user data, DDL stores an indication of whether quick pass write programming is used, ADL stores a lower page of data, BDL stores a middle page of data, and CDL stores an upper page of data.

Processor 492 performs computations, such as to determine the data stored in the sensed storage element and store the determined data in the set of data latches. Each set of data latches 494-497 is used to store data bits that are determined by processor 492 during a read operation, and to store data bits imported from the data bus 231 during a programming operation which represent write data that is meant to be programmed into the memory. The I/O interface 496 provides an interface between data latches 494-497 and the data bus 231.

During reading, the operation of the system is under the control of state machine 312 that controls the supply of different control gate voltages to the addressed storage element 10. As it steps through the various predefined control gate voltages corresponding to the various memory states supported by the memory, the sense module 480 may trip at one of these voltages and a corresponding output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494-497. In another embodiment of the managing circuit 490, the bit line latch 482 operates in a double duty capacity, both as a latch for latching the output of the sense module 480 and also as a bit line latch as described above.

During program or verify operations, the data to be programmed (write data) is stored in the set of data latches 494-497 from the data bus 231. The programming operation, under the control of the state machine 312, comprises a series of programming voltage pulses applied to the control gates of the addressed storage elements. Each program pulse is followed by a read back (verify) to determine if the storage element has been programmed to the desired memory state. In some cases, processor 492 monitors the read back memory state relative to the desired memory state. When the two are in agreement, the processor 492 proceeds to set the bit line latch 482 to cause the bit line to be pulled to a state designating program inhibit. This inhibits the storage element coupled to the bit line from further programming even if program pulses appear on its control gate. In other embodiments, the processor initially loads the bit line latch 482 and the sense circuitry sets it to an inhibit value during the verify process.

As mentioned, each set of data latches 494-497 may be implemented as a stack of data latches for each sense module. In one exemplary embodiment, there are three data latches per sense module 480. In some implementations, data latches are implemented according to a shift register so that the parallel data that is stored therein is converted to serial data for data bus 231, and vice versa. For example, all data latches corresponding to the read/write block of M storage elements can be linked together to form a block shift register so that a block of data can be input or output by serial transfer. In particular, the bank of read/write modules may be adapted in order that each of its set of data latches will shift data into or out of the data bus in sequence as if they are part of a shift register for the entire read/write block.

The data latches identify when an associated storage element 10 has reached certain mileposts in a programming operation. For example, latches may identify if a storage element's $V_{th}$ is below a particular verify level. Data latches indicate whether a storage element currently stores one or more bits from a page of data. For example, with respect to one exemplary embodiment, the ADL latch is flipped (e.g., from 0 to 1) when a lower page bit is stored in an associated storage element. Further, the BDL latch is flipped when a middle page bit is stored in an associated storage element. And the CDL latch is flipped when an upper page bit is stored in an associated storage element. A bit is stored in a storage element when the $V_{th}$ exceeds an associated verify level.

As mentioned above, these high storage density memory structures, such as the BiCS type described, for example, with respect to the exemplary embodiment shown in FIG. 9, have relatively small spacing between adjacent memory cells and each cell has a relatively small tolerance between discrete voltage ranges for memory functions. Accordingly, improving the amount of efficient storage capability within a fixed die size has competing drawbacks and liabilities. Therefore, various approaches and corrective and compensatory measures may be employed to improve the accuracy, reliability, and efficiency of the memory operations. Such measures aim, for example, at minimizing the interference between, for example, neighboring word lines (WL), and at fortifying short-term data retention with respect to scalable memory structures. Of particular interest here is the debilitating occurrence of a "slow to erase" phenomenon as the result of one or more abnormalities existing within a scalable memory structure. Such an abnormality may be the result of a variety of manufacturing or operational defects, such as, for example, an actual word line-to-word line or a word line-to-memory hole short. According to certain observations, the electrical behavior that is caused by such a defect may create a "trailing" threshold voltage ($V_{th}$) level of an "erase" state of the defective memory element. Accordingly, even though on a memory cell to memory cell basis, the erase state is correctly inhibited, a larger-than-intended program voltage bias (VPGM) level may build up as a result of the defect, thereby inadvertently programming the "erase" state to a higher state. Nonetheless, as described in greater detail below, an erase/verify memory operation that is conducted under this condition with respect to a defective memory element may still surreptitiously pass a bit scan mode criterion. Accordingly, not until a subsequent read/verify memory operation is performed will the issue be detected. However, at that juncture, both the integrity and reliability of the programmed data may already be compromised and conceivably result in an uncorrectable error code correction (UECC) failure.

Figure 15A:
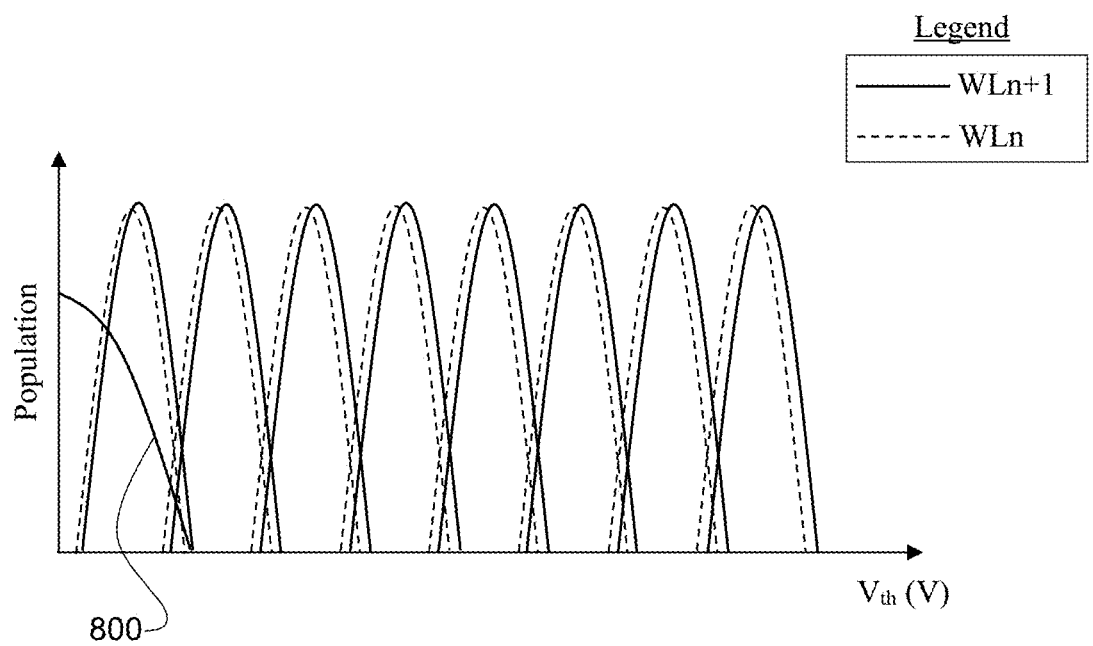
FIG. 15A is a distribution plot depicting a programming operation with respect to two neighboring word lines of a memory device, wherein a threshold voltage ($V_{th}$) level is exhibited with respect to an "erased" state of one of the word lines, in accordance with exemplary embodiments.
Figure 15B:
FIG. 15B is a distribution plot depicting an erase verify operation with respect to the memory device of FIG. 15A, wherein a "slow to erase" signature threshold voltage ($V_{th}$) level remains, in accordance with exemplary embodiments.

To generally explain this "slow to erase" phenomenon, FIG. 15A depicts an example distribution plot of the threshold voltage ($V_{th}$) distribution of a population of memory cells comprising a given memory structure. In this particular example, the memory cells are of the TLC-type density. Accordingly, the distribution plot indicates the eight programmable states, including an "erase" state. Furthermore, at focus in this distribution plot are the respective threshold voltage ($V_{th}$) distribution curves of two representative neighbor word lines of the memory structure, i.e., word lines "WLn" and "WLn+1", wherein word line "WLn+1" is an otherwise healthy word line and "WLn" comprises a structural defect such as a word line-to-memory hole short. Accordingly, the threshold voltage ($V_{th}$) distribution curve (see the dotted curve) with respect to the word line "WLn+1" appears as expected with a proper erase inhibit condition. By contrast, with respect to the defective word line "WLn," there appears to be a discernible threshold voltage ($V_{th}$) level (see the solid curve) clearly being exhibited by the memory cells in the "erase" state, as shown by the upper tail 800 of the distribution curve. As a consequence, the memory cells in the "erase" state may be misread as being programmed to a higher state. Therefore, after an erase/verify operation is conducted in order to erase the programmed data, there remains the upper tail portion 800 of the threshold voltage ($V_{th}$) of the distribution curve with respect to the "erase" state (as depicted in FIG. 15B). Accordingly, the "erase" state is now skewed as a result of this remnant in which the threshold voltage ($V_{th}$) distribution of the "erase" state is greater than zero after an erase/verify memory operation is completed.

As mentioned above, according to certain observations, a memory structure that comprises a defect causing a "slow to erase" condition may nonetheless pass a bit scan mode criterion during an erase/verify operation, thus making it difficult to rapidly catch and address using, for example, error correction methods. As discovered, a root cause in some memory structures of this masked defect during an erase/verify operation is a condition that may be described as a NAND string resistance effect that occurs during an erase/verify operation that operates to verify all word lines of a memory structure together. In an erase/verify operation scheme of this type, the net threshold voltage ($V_{th}$) of a "slowest to erase" word line (WL) of a memory structure may be defined by the following equation, i.e., "Equation #1":

Net $V_{th}$=True $V_{th}$+$V_{th}$ increase due to NAND string resistance, wherein the "True $V_{th}$" is the actual threshold voltage ($V_{th}$) level seen/exhibited by the memory cells. Therefore, with respect to a normal (non-defective) memory cell, the increase in the threshold voltage ($V_{th}$) due to the NAND string resistance effect (as accumulated across the multiple word lines) is relatively large and, as a result, the actual threshold voltage ($V_{th}$) level ("True $V_{th}$") is artificially diminished such that it appears to be less. However, concerning a memory cell that exhibits a "slow to erase" behavior, an increased erase/verify voltage bias is required in order for the memory structure to pass according to a bit scan mode criterion. As a result of applying this relatively high erase/verify voltage bias to all word lines (WLs) of the memory structure, the comparative increase in the threshold voltage ($V_{th}$) level due to a NAND string resistance effect becomes increasingly negligible. Thus, according to the "Equation #1" above, the actual threshold voltage ($V_{th}$) level ("True $V_{th}$") of the "slowest to erase" word line appears to be quite large, thereby readily passing a bit scan mode criterion applied during the erase/verify operation.

The erase/verify voltage bias is even further increased in the circumstance in which an alternate word line erase/verify scheme is applied. In such a case, only alternating word lines (WLs) comprising a memory structure are selected during an erase/verify memory operation. Therefore, during an erase/verify operation, the unselected word lines see a relatively large erase/verify voltage bias, thereby resulting in the selected word lines experiencing a relatively shallower threshold voltage ($V_{th}$) level. As such, the actual threshold voltage ($V_{th}$) level of the "slowest to erase" word line appears even higher when combined with the effect of the NAND string resistance.

Therefore, it would be advantageous to derive detection or corrective mechanisms for addressing the "slow to erase" behavior as a result of a structural defect (e.g., a word line-to-memory hole short) in a memory structure that operate to detect/catch/identify the defective memory component and designate such a memory component with a "fail" (or an "unusable") status at an earlier point in time prior to reaching or causing a corrupted data state while the memory device is being used in situ. In addition, it would be beneficial if such derived mechanisms can be conducted on the chip level in an efficient and cost-effective manner and without inadvertently compromising the data reliability and structural integrity of the memory device.

Figure 16:
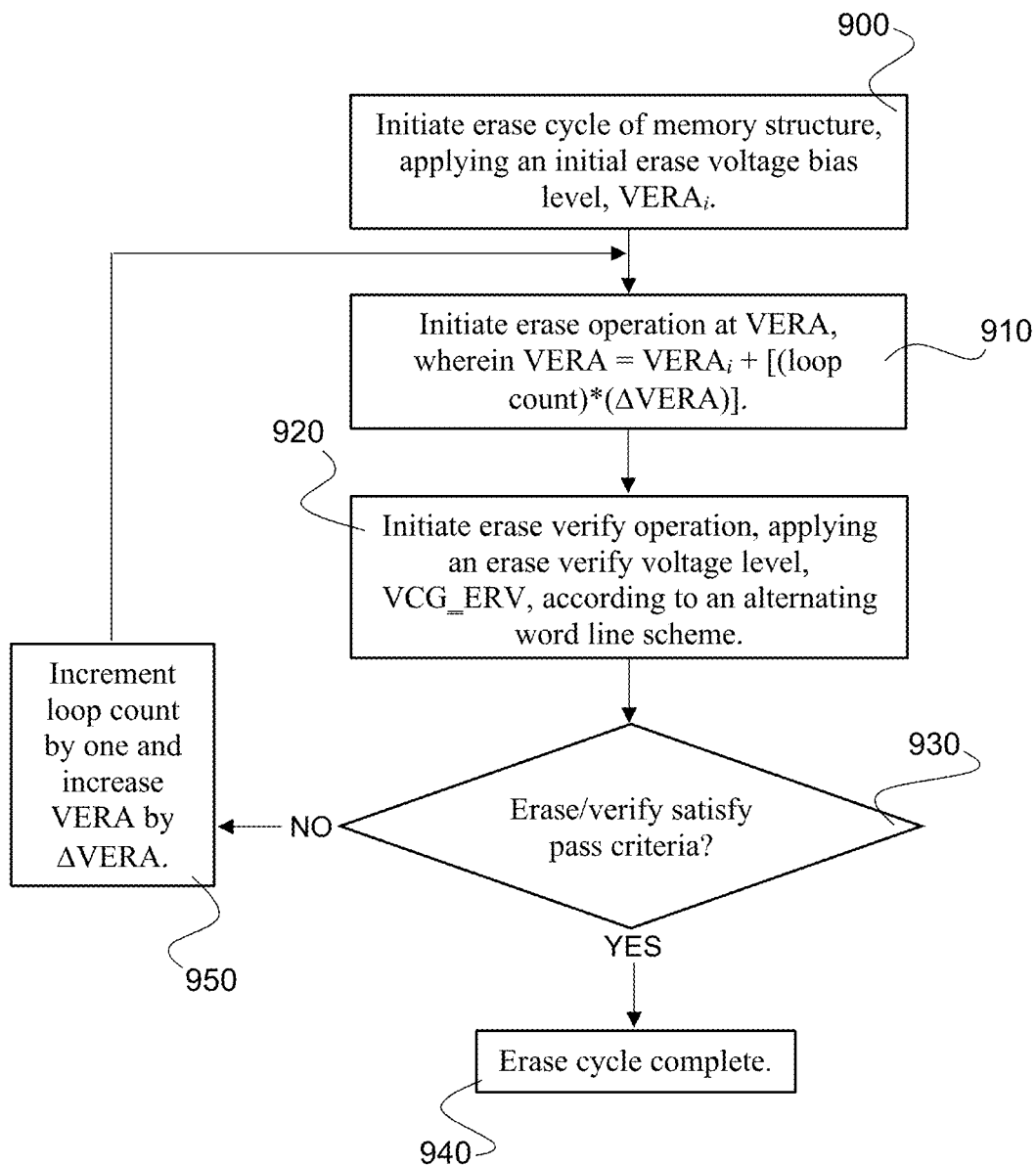
FIG. 16 is a flow diagram generally illustrating the steps of an erase verify memory operation, in accordance with exemplary embodiments.

Referring now to FIG. 16, there is depicted an exemplary embodiment of an erase operation cycle that, according to certain observations, may fail to detect a "slow to erase" signature of a defective memory cell that, for example, is the result of a single word line-to-memory hole short. Starting at step 900, an erase cycle of a memory structure is initiated by applying an initial erase voltage bias level (VERA). Thus, in response to the initiated erase memory command, a current erase operation is performed by applying an erase voltage bias (VERA) at step 910, wherein the erase voltage bias (VERA) may be defined by the following equation, i.e., "Equation #2":

$$VERA=VERA_i+[(\text{loop count})*(\Delta VERA)],$$

wherein the quantity "$VERA_i$" is the erase voltage bias level initially applied at the start of the erase cycle in step 900, the "loop count" is the total number of erase loops conducted during the erase cycle, and the quantity "$\Delta VERA$" is the incremental change in the erase voltage bias level (VERA) applied at each successive erase loop of the erase cycle. Therefore, according to "Equation #2", at a first erase loop at the beginning of the erase cycle, the erase voltage bias (VERA) is equal to the initial erase voltage bias level, $VERA_i$. Upon completion of the erase operation, a subsequent erase verify operation is initiated at step 920 to determine whether the erase operation is complete. Accordingly, as indicated, an erase verify voltage (VCG_ERV) is applied to the memory structure. In this particular embodiment, the erase verify operation is applied according to an alternating word line (WL) scheme. Thereafter, at step 930, a determination is made, according to a bit scan mode, as to whether the memory cell(s) of the structure are properly exhibiting an "erase" state such that the erase cycle is complete. Thus, if the bit scan mode criteria applied at step 930 is satisfied, the erase cycle is summarily deemed complete at step 940. However, if the bit scan mode criteria is not satisfied at step 930, a next erase loop is initiated. As such, a loop count is incremented by one and the erase voltage bias (VERA) is increased by a pre-determined incremental voltage (ΔVERA) (see step 950). The above-described procedure continues until the bit scan mode criteria is ultimately satisfied (see step 940).

Figure 17:
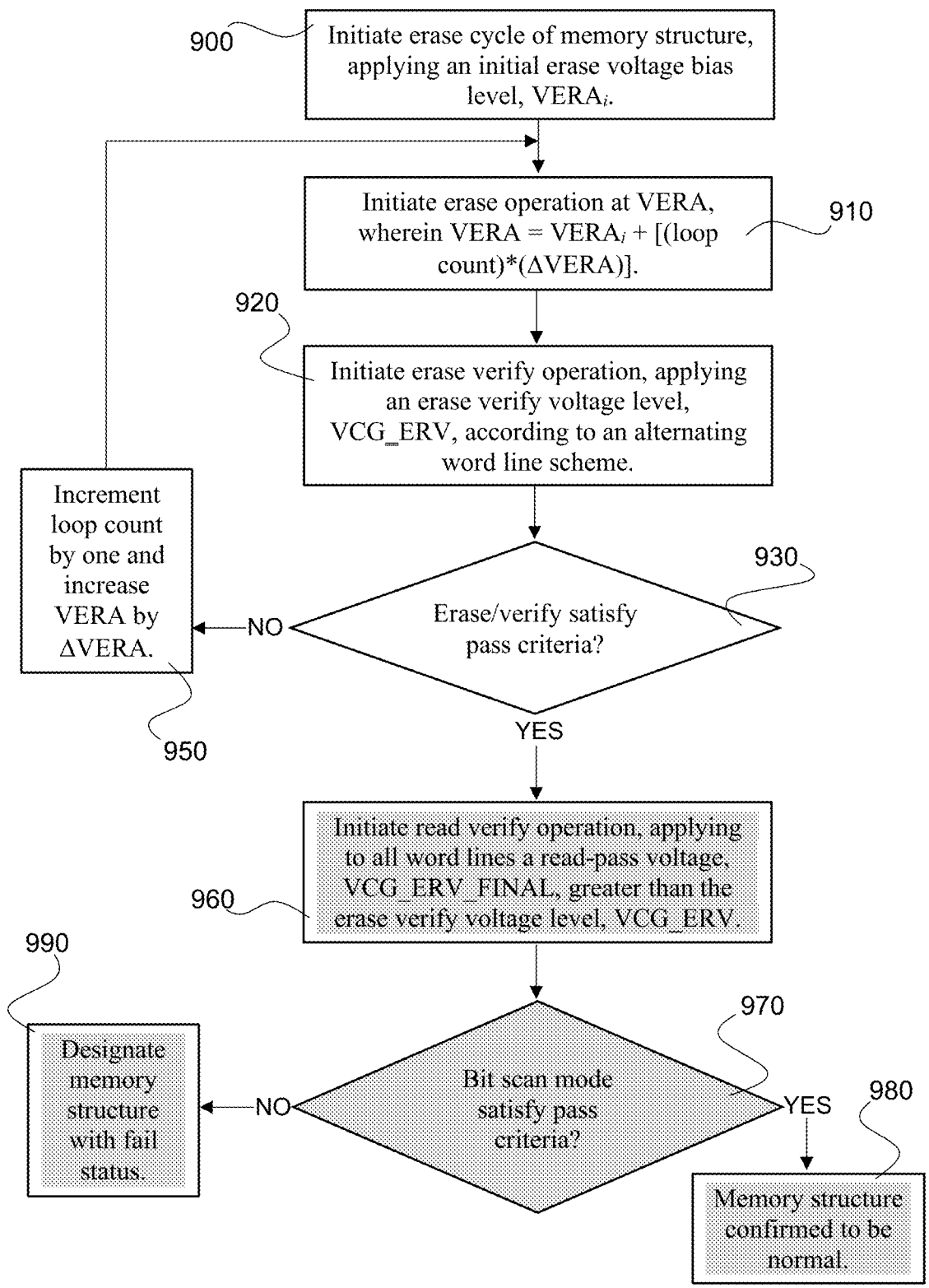
FIG. 17 is a flow diagram generally illustrating the steps of an erase verify memory operation that further comprises a subsequent read operation, in accordance with exemplary embodiments.

As described above, it is possible that a "slow to erase" malignancy may evade an erase/verify operation, such as the process described above and depicted in FIG. 16, due to the reasons previously discussed. Thus, according to the present disclosure, FIG. 17 depicts an exemplary embodiment of a mechanism for more precisely detecting or identifying a "slow to erase" signature of a defective memory structure even in the event that the erase/verify bit scan mode criteria applied, for example, in step 930 of the embodiment of FIG. 16, appears to be satisfied. As indicated in FIG. 17, the sequence of steps comprising the erase/verify operation generally remain similar or identical to the steps 900, 910, 920, 930, and 950 of the procedure detailed in FIG. 16. However, this process, as generally outlined in FIG. 17, strictly departs from the procedure in FIG. 16 upon determining, at step 930, that the bit scan mode criteria applied during the erase verify operation is satisfied. Specifically, unlike the conclusory step 940 that is taken in the procedure in FIG. 16, a subsequent read memory operation is next applied in the procedure of FIG. 17 in order to confirm whether the memory structure is indeed normal or whether it comprises a "slow to erase" signature indicative of a defect. Therefore, rather than proceeding with a wholesale assumption that fulfillment of a bit scan mode criteria accurately demonstrates that a memory structure is operating properly, the mechanism of the exemplary embodiment depicted in FIG. 17 applies an additional confirmatory step to obtain a complete verification. Namely, beginning at step 960, once the determination is made at step 930 that the erase/verify bit scan mode criteria is satisfied, a read memory operation is then initiated by applying to all word lines (WLs) of the memory structure a read-pass voltage level (VCG_ERV_FINAL) greater in magnitude than the erase verify voltage level (VCG_ERV) that was previously applied in step 920 during the erase verify operation. Next, at step 970, a read verify operation is conducted following the application of the read-pass voltage and a determination is thereafter made as to whether the bit scan mode pass fail (BSPF) criteria is satisfied. If the bit scan mode criteria is satisfied, the memory structure can be confirmed to be normal (see step 980). However, if there is a failure according to the bit scan mode criteria, this result strongly indicates a presence of a "trailing" threshold voltage ($V_{th}$) of the "erase" state. Accordingly, at step 990, the memory structure is designated with a fail status.

Figure 18:
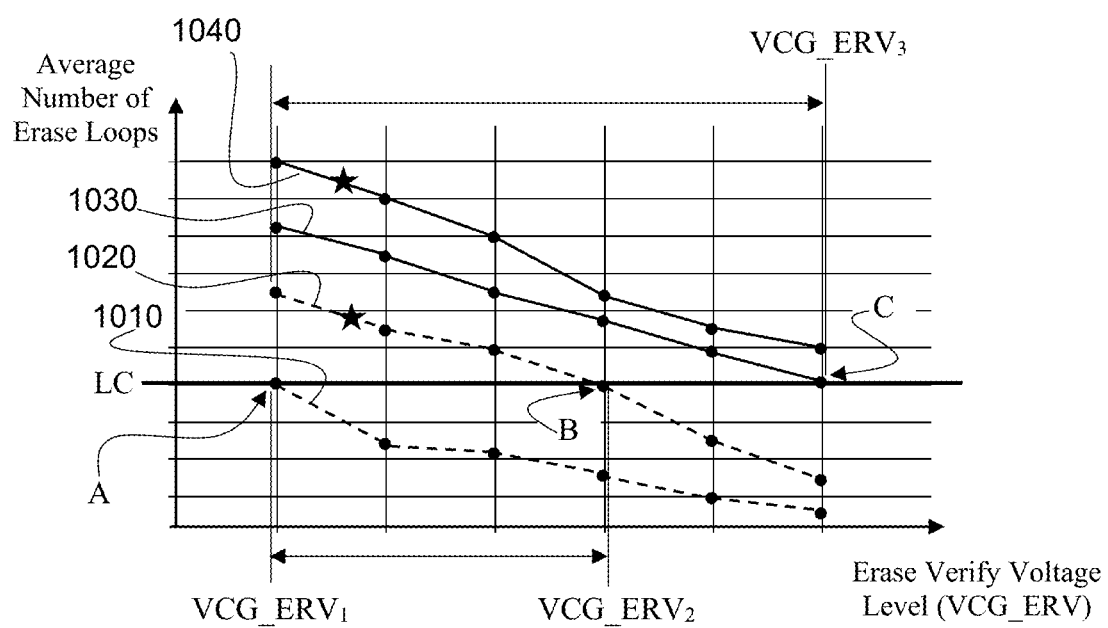
FIG. 18 is a line plot that demonstrates the logic principles by which the operation of FIG. 17 detects a "slow to erase" signature threshold voltage ($V_{th}$) level, in accordance with exemplary embodiments.

Provided in FIG. 18 is an explanatory graphical chart 1000 illustrating the principle by which the "read after erase" procedure described above according to the exemplary embodiment of FIG. 17 succeeds in identifying a defective memory element that may otherwise remain undetected in a straightforward erase verify operation (e.g., the erase verify operation that was depicted in FIG. 16). In FIG. 18, there is shown, according to observations and data obtained through experimentation and/or in situ (in the field), a line plot for each of four erase verify operation scenarios. The graphical chart is comprised of two axes, wherein the vertical axis indicates an average number of erase loops required to pass a bit scan mode criteria, and the horizontal axis indicates a respective erase verify voltage level (VCG_ERV) applied during the erase verify operation. Thus, each line plot 1010, 1020, 1030, and 1040 depicts, regarding its respective erase verify operation scenario, the relationship between an erase loop count that is required in order to pass a bit scan mode criteria and the applied erase verify voltage level (VCG_ERV). Beginning with line plot 1010, the scenario depicted therein is with respect to a normal (non-defective) memory structure that undergoes an erase verify operation applied to alternating word lines (WLs) (e.g., see step 920 in FIGS. 16 and 17). By contrast, the line plot 1030 depicts the scenario in which the normal memory structure undergoes an erase verify operation applied to all word lines (WLs) (e.g., see steps 960 and 970 of FIG. 17). Further, the line plot 1020 portrays the scenario in which a defective memory structure undergoes an erase verify operation applied to alternating word lines. Lastly, the line plot 1040 demonstrates the scenario in which the defective memory structure undergoes an erase verify operation that is applied to all of the word lines. In each of the four erase verify operation scenarios, the lowest erase loop count at which a bit mode scan criteria is earliest satisfied (relative to an increasing applied erase verify voltage level, VCG_ERV) is indicated in FIG. 18 at the number "LC."

Accordingly, line plots 1010 and 1020 illustrate the erase verify operation mode described in step 920 of the exemplary embodiments set forth in FIGS. 16 and 17. Namely, an erase verify voltage level (VCG_ERV) is applied to alternating word lines (WLs) of a memory structure according to a basic erase verify operation scheme. As explained above, this type of erase verify operation scheme, and coupled with a NAND string resistance effect, elevates the necessary erase verify voltage level (VCG_ERV) required to pass the bit scan mode criteria. Accordingly, although a normal memory structure (non-defective) may readily pass a bit scan mode criteria at a lowest erase loop count (LC) at a relatively low erase verify voltage level (indicated at $VCG\_ERV_1$)—see point "A" in FIG. 18—it is likely that an elevated erase verify voltage level will initially be applied. Thus, as depicted in the line plot 1020, if the memory structure also comprises a defective memory element (e.g., a cell, string or block), the memory structure will still easily pass the bit scan mode criteria at the same erase loop count LC when applying just a slightly higher erase verify voltage (indicated at $VCG\_ERV_2$)—see point "B" in FIG. 18. In such a case, a memory structure that comprises a defective memory element will nonetheless easily avoid detection.

Turning now to the line plots 1030 and 1040 in FIG. 18, they may be visualized or interpreted as relating to the same memory structure(s) observed with respect to line plots 1010 and 1020, wherein the only distinction lies in the fact that the respective erase verify operation is applied to all word lines (WLs) rather than to alternating word lines. As depicted, according to this "all word lines" erase verify scheme, if a sizable enough erase verify voltage level (VCG_ERV) is applied to the memory structure during the erase verify operation, a defective memory structure will assuredly not pass the bit scan mode criteria at the instance in which the lowest erase loop count LC is reached. As indicated at point "C" in FIG. 18, upon applying an erase verify voltage level (shown at $VCG\_ERV_3$ in FIG. 18) that is sufficiently greater than the erase verify voltage level at which the defective memory structure satisfies the bit scan mode criteria according to an alternating word line erase verify scheme (see $VCG\_ERV_2$ of line plot 1020), a normal memory structure will pass the bit scan mode criteria and a defective memory structure will not pass the bit scan mode criteria.

Therefore, to ensure that a defective memory structure is caught well before it enters circulation to be usefully programmed, a "read after erase" mechanism, such as the exemplary embodiment depicted in FIG. 17, may be employed by applying a read-pass voltage (VCG_ERV_FINAL) that is sufficiently greater than the erase verify voltage level at which the defective memory structure satisfies the bit scan mode criteria according to an alternating word line erase verify scheme. Accordingly, in maintaining the nomenclature indicated in FIG. 18 above, the applied read-pass voltage (VCG_ERV_FINAL) applied at step 960 in FIG. 17 may be defined according to the following equation, i.e., "Equation #3":

$$VCG\_ERV\_FINAL \geq VCG\_ERV_3, \text{ wherein } VCG\_ERV_3 > VCG\_ERV_2.$$

Each of voltage levels $VCG\_ERV_2$, $VCG\_ERV_3$, and VCG_ERV_FINAL may be determined according to experimental, and/or in situ, observations and data with respect to a given memory structure, wherein a magnitude of the applied read-pass voltage (VCG_ERV_FINAL) is sufficiently large enough to ensure that, at a lowest erase loop count, only a normal memory structure will pass the predetermined bit scan mode criteria. According to some exemplary embodiments, the read-pass voltage level (VCG_ERV_FINAL) applied at step 960 may fall somewhere within a range of approximately 0.5 V to 2.0 V. This particular voltage range of the read-pass voltage (VCG_ERV_FINAL) is significantly below other regularly used bias voltages on all word lines (WLs) (e.g., VREAD and VPASS voltage biases), which are typically in the range of 6 volts or higher, during the regular verify and program operations. Hence, application of the read-pass voltage level (VCG_ERV_FINAL) according to the exemplary embodiments described herein is not expected to cause any negative impacts to the integrity and reliability of the memory cell structure.

A few other parameters can also be used to optimize this "read after erase" procedure, including but not limited to, a bit-ignore setting (BSPF_FINAL), bit-line voltage (VBLC_ERV_FINAL), which may or may not be different from that used during regular erase verify operations.

The above discussion is meant to be illustrative of the principles and various embodiments of the present disclosure. Numerous variations and modifications will become apparent to those skilled in the art once the above disclosure is fully appreciated. For example, although on-memory controllers are described as performing or controlling the exemplary embodiments set forth above, any processor that executes software within a host system can perform the exemplary embodiments described above without departing from the scope of the disclosure. In particular, the methods and the techniques that are described herein as being performed in the on-memory controller(s), may also be performed in a host. Furthermore, the methods and the concepts disclosed herein may be applied to other types of persistent memories other than flash. It is intended that the following claims be interpreted to embrace all such variations and modifications.

What is claimed is:

1. A method for detecting a "slow to erase" condition of a non-volatile memory structure, comprising:
   initiating an erase/verify memory operation with respect to the memory structure, wherein the erase/verify memory operation comprises applying an erase verify voltage level to the memory structure according to an alternating word line scheme;
   following the erase/verify memory operation, determining if a first bit scan mode criteria is satisfied;
   if the first bit scan mode criteria is satisfied, initiating a read/verify memory operation, wherein:
      the read/verify memory operation comprises applying a read-pass voltage level to the memory structure according to an all word line scheme; and
      a magnitude of the read-pass voltage level is greater than a magnitude of the erase verify voltage level;
   following the read/verify memory operation, determining if a second bit scan mode criteria is satisfied; and
   if the second bit scan mode criteria is not satisfied, designating the memory structure with a fail status.

2. The method according to claim 1, wherein the non-volatile memory structure comprises a three-dimensional NAND-type memory array.

3. The method according to claim 1, wherein:
   following the erase/verify memory operation, at least one memory element of the non-volatile memory structure exhibits a trailing threshold voltage distribution with respect to an erase state thereof; and
   wherein the magnitude of the erase verify voltage level is such that, irrespective of the trailing threshold voltage distribution, the first bit scan mode criteria is satisfied.

4. The method according to claim 1, wherein:
   following the erase/verify memory operation, at least one memory element of the non-volatile memory structure exhibits a trailing threshold voltage distribution with respect to an erase state thereof; and
   wherein the magnitude of the read-pass voltage level is such that the trailing threshold voltage distribution results in failing to satisfy the second bit scan mode criteria.

5. The method according to claim 4, wherein the at least one memory element comprises a word line-to-memory hole short.

6. The method according to claim 1, wherein the magnitude of the erase verify voltage level is in the range of 0.1 volts to 0.5 volts.

7. The method according to claim 6, wherein the magnitude of the read-pass voltage level is in the range of 0.5 volts to 2.0 volts.

8. A memory controller, comprising:
   a first communication pathway configured to couple to a non-volatile memory structure; and
   the memory controller configured to:
      initiate an erase/verify memory operation with respect to the memory structure, wherein the erase/verify memory operation comprises applying an erase verify voltage level to the memory structure according to an alternating word line scheme;
      following the erase/verify memory operation, determine if a first bit scan mode criteria is satisfied;
      if the first bit scan mode criteria is satisfied, initiate a read/verify memory operation, wherein:
         the read/verify memory operation comprises applying a read-pass voltage level to the memory structure according to an all word line scheme; and
         a magnitude of the read-pass voltage level is greater than a magnitude of the erase verify voltage level;
      following the read/verify memory operation, determine if a second bit scan mode criteria is satisfied; and
      if the second bit scan mode criteria is not satisfied, designate the memory structure with a fail status.

9. The memory controller according to claim 8, wherein the non-volatile memory structure comprises a three-dimensional NAND-type memory array.

10. The memory controller according to claim 8, wherein:
    following the erase/verify memory operation, at least one memory element of the non-volatile memory structure exhibits a trailing threshold voltage distribution with respect to an erase state thereof; and wherein the magnitude of the erase verify voltage level is such that, irrespective of the trailing threshold voltage distribution, the first bit scan mode criteria is satisfied.

11. The memory controller according to claim 8, wherein:

following the erase/verify memory operation, at least one memory element of the non-volatile memory structure exhibits a trailing threshold voltage distribution with respect to an erase state thereof; and wherein the magnitude of the read-pass voltage level is such that the trailing threshold voltage distribution results in failing to satisfy the second bit scan mode criteria.

12. The memory controller according to claim 11, wherein the at least one memory element comprises a word line-to-memory hole short.

13. The memory controller according to claim 8, wherein the magnitude of the erase verify voltage level is in the range of 0.1 volts to 0.5 volts.

14. The memory controller according to claim 13, wherein the magnitude of the read-pass voltage level is in the range of 0.5 volts to 2.0 volts.

15. A non-volatile memory system, comprising:

a memory structure; and a memory controller coupled to the memory structure and:

initiating an erase/verify memory operation with respect to the memory structure, wherein the erase/verify memory operation comprises applying an erase verify voltage level to the memory structure according to an alternating word line scheme;

following the erase/verify memory operation, determining if a first bit scan mode criteria is satisfied;

if the first bit scan mode criteria is satisfied, initiating a read/verify memory operation, wherein:

the read/verify memory operation comprises applying a read-pass voltage level to the memory structure according to an all word line scheme; and a magnitude of the read-pass voltage level is greater than a magnitude of the erase verify voltage level;

following the read/verify memory operation, determining if a second bit scan mode criteria is satisfied; and if the second bit scan mode criteria is not satisfied, designating the memory structure with a fail status.

16. The non-volatile memory system according to claim 15, wherein:

following the erase/verify memory operation, at least one memory element of the memory structure exhibits a trailing threshold voltage distribution with respect to an erase state thereof; and wherein the magnitude of the erase verify voltage level is such that, irrespective of the trailing threshold voltage distribution, the first bit scan mode criteria is satisfied.

17. The non-volatile memory system according to claim 15, wherein:

following the erase/verify memory operation, at least one memory element of the memory structure exhibits a trailing threshold voltage distribution with respect to an erase state thereof; and wherein the magnitude of the read-pass voltage level is such that the trailing threshold voltage distribution results in failing to satisfy the second bit scan mode criteria.

18. The non-volatile memory system according to claim 17, wherein the at least one memory element comprises a word line-to-memory hole short.

19. The memory controller according to claim 15, wherein the magnitude of the erase verify voltage level is in the range of 0.1 volts to 0.5 volts.

20. The memory controller according to claim 19, wherein the magnitude of the read-pass voltage level is in the range of 0.5 volts to 2.0 volts.

* * * * *